FADER AMPLIFIER CIRCUITS

Filed Jan. 26, 1965 10 Sheets-Sheet 1

Oct. 14, 1969 A. R. KAYE ET AL 3,472,957

FADER AMPLIFIER CIRCUITS

Filed Jan. 26, 1965 10 Sheets-Sheet 4

Oct. 14, 1969 A. R. KAYE ET AL 3,472,957

FADER AMPLIFIER CIRCUITS

Filed Jan. 26, 1965 10 Sheets-Sheet 7

Oct. 14, 1969 A. R. KAYE ET AL 3,472,957

FADER AMPLIFIER CIRCUITS

Filed Jan. 26, 1965 10 Sheets-Sheet 9

United States Patent Office 3,472,957
Patented Oct. 14, 1969

3,472,957
FADER AMPLIFIER CIRCUITS
Alan R. Kaye and Gordon B. Thompson, Ottawa, Ontario, Canada, assignors to Northern Electric Company Limited, Montreal, Quebec, Canada
Filed Jan. 26, 1965, Ser. No. 428,175
Int. Cl. H04n 3/16
U.S. Cl. 178—7.1 20 Claims

ABSTRACT OF THE DISCLOSURE

Circuits for mixing and/or fading television signals, especially colour television signals, while preserving the synchronizing information in correct amplitude, even when the picture information is faded or mixed in a non-complementary manner.

Circuits are also described for achieving special effects, such as the introduction of inserts into a television picture background display.

This invention relates to signal processing amplifiers, and in particular it relates to fader amplifiers for mixing or fading or otherwise combining signals, usually television signals.

Fader amplifiers are commonly used for direct superposition of television signals, for simultaneous fading in of one signal and fading out of another signal, or for fading in or fading out a pair of superimposed signals. Although such amplifiers may thus be used for processing the television signals without fading, they will be referred to in this specification as "fader amplifiers." Moreover, the term "amplifier" is used in the sense of a circuit for modifying the amplitude of a signal, not necessarily to increase it.

In a common use of fader amplifiers two inputs signals A and B are provided to the amplifier and the amplifier is controlled (generally by manually operable control members) to vary the strength of the amplifier output signal S and to vary the proportions of input signals A and B present in such output. In such a case the output signal S from the fader amplifier may be expressed as $$S=pA+qB \qquad (1)$$

wherein input signals A and B are assumed to have the standard nominal television level and $p$ and $q$ are co-efficients each varying between zero and unity, depending upon control of the amplifier.

Commonly the amplifier is controlled to reduce the strength of one signal to zero while increasing the strength of the other signal simultaneously, so as theoretically to maintain output signal S at a constant strength while merging the content of signal S from solely one input signal (A, for example) to solely the other input signal (B in this example). Operation of this nature is known as complementary mix and in such a case the sum of the coefficients $p$ and $q$ is always equal to unity. Another way of expressing the form of the output signal is then:

$$S=(1-k)A+kB \qquad (2)$$

where $k$ is a coefficient varying between 0 and 1 depending upon control of the amplifier. It will be noted that the sum of the coefficients of signals A and B is always unity in a complementary mix.

The same fader amplifier can be used to perform a non-complementary mix, in which the total output signal strength does not remain constant. In a non-complementary mix the sum of the coefficients $p$ and $q$ may vary between zero and two, depending on whether both signals A and B are faded out together (in which case $p=q=0$) or are fully superimposed (in which case $p=q=1$).

When the amplifier performs a complementary mix of television signals, the amplitude of the synchonizing information in the output signal S always remains at the predetermined level required for television synchronizing information. This result stems from the fact that, as the component of synchronizing information in the output provided by one of the input signals A decreases, the component of synchronizing information provided by the other input signal B correspondingly increases to maintain constant the total amplitude of synchronizing information in the output signal.

However, when the conventional fader amplifier is used to perform a non-complementary mix of video signals, the amplitude of the synchonizing information in the output signal normally will vary during the mix (as the total output signal strength varies) and the synchronizing information may be lost completely if both input signals A and B are faded to zero simultaneously. Since it is essential that synchronizing information always be present and be of relatively constant amplitude, it has been the practice to insert synchronizing information after the fader amplifiers to permit full freedom of operation of the amplifiers in performance of such picture information signal mixes as are desired.

With the advent of colour television this procedure became inappropriate for the following reason. The colour synchronizing information, i.e. the colour burst, is very precisely timed (generally to with a few nanoseconds) and synchronizing switching and distribution systems are generally incapable of transmitting the colour burst with the required timing accuracy. Therefore the colour burst preferably should remain with the picture information signal at all times, rather than be temporarily removed therefrom for routing around the fader amplifier stages and subsequently recombined therewith. Since the composite signal containing the colour burst cannot be faded to zero in a fader amplifier without loss of synchronizing information, a different approach to the fading of colour television signals has become necessary.

Accordingly, it is an object of the present invention in another of its aspects to provide a fader amplifier in which two television signals containing synchronizing information may be mixed, faded, or otherwise combined as desired while preserving the synchronizing information in correct amplitude relation in the output.

A further object of the present invention in another of its aspects is to provide a simplified arrangement, employing fader amplifiers, in which special effects, such as fading of a television picture insert into a television picture background display, may be achieved.

Further understanding of the various aspects of the present invention will be facilitated by reference to the accompanying drawings, the specific circuits illustrated being provided by way of example only, and the scope of the invention being defined by the appended claims.

Figures 12, 13, 14, 15, 16:
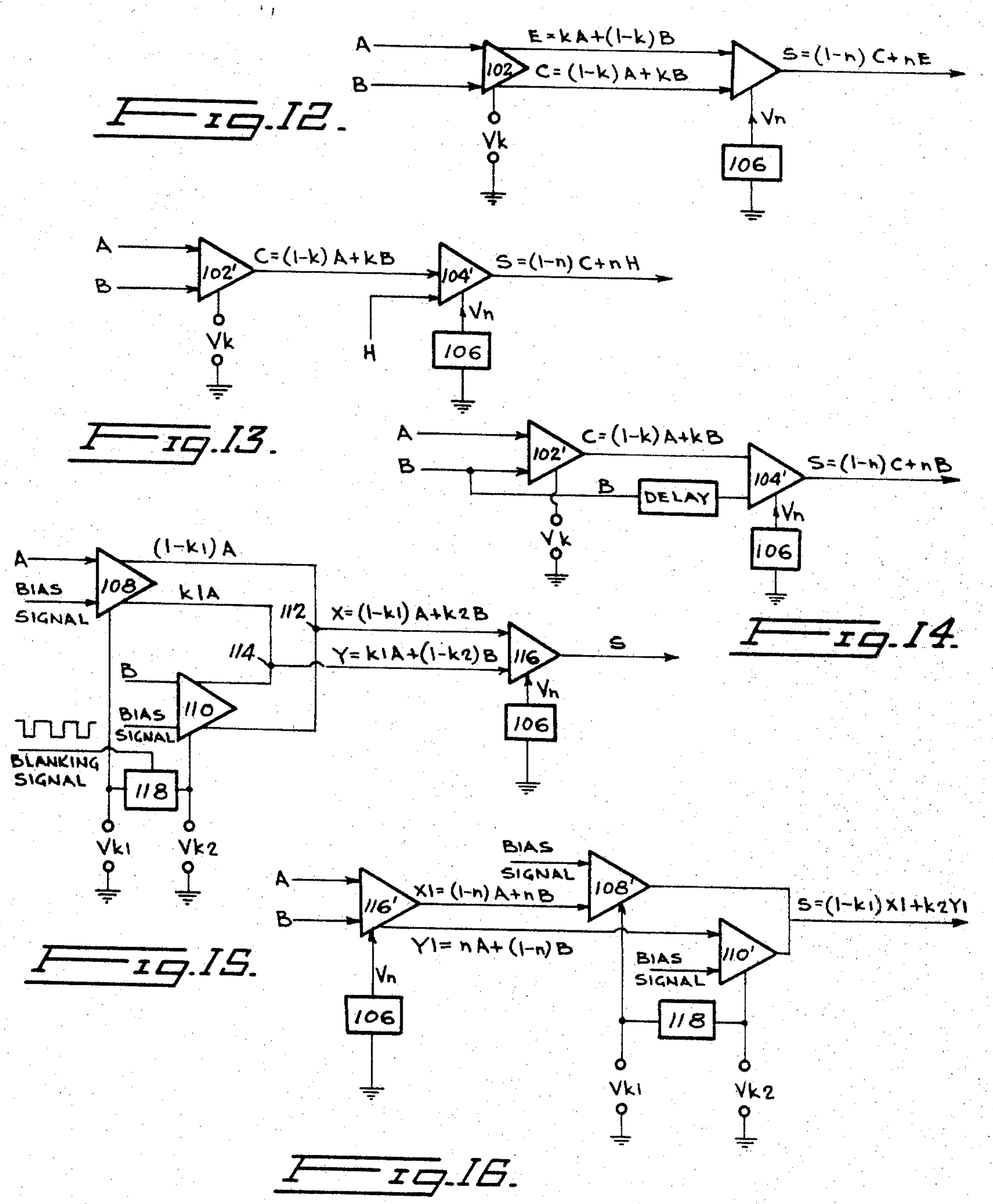
FIGURE 12 is a block diagram for an arrangement for achieving special effects.
FIGURE 13 shows a modification of the arrangement of FIGURE 12.
FIGURE 14 shows a modification of the arrangement of FIGURE 13.
FIGURE 15 is a block diagram for another arrangement for achieving special effects.
FIGURE 16 shows a modification of the arrangement of FIGURE 15.
Figure 25:
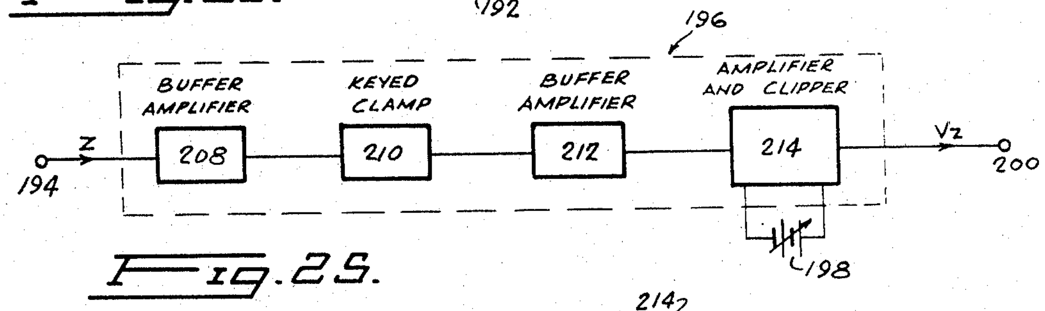
FIGURE 25 is a block diagram for a part of the arrangement of FIGURE 23.
Figure 26:
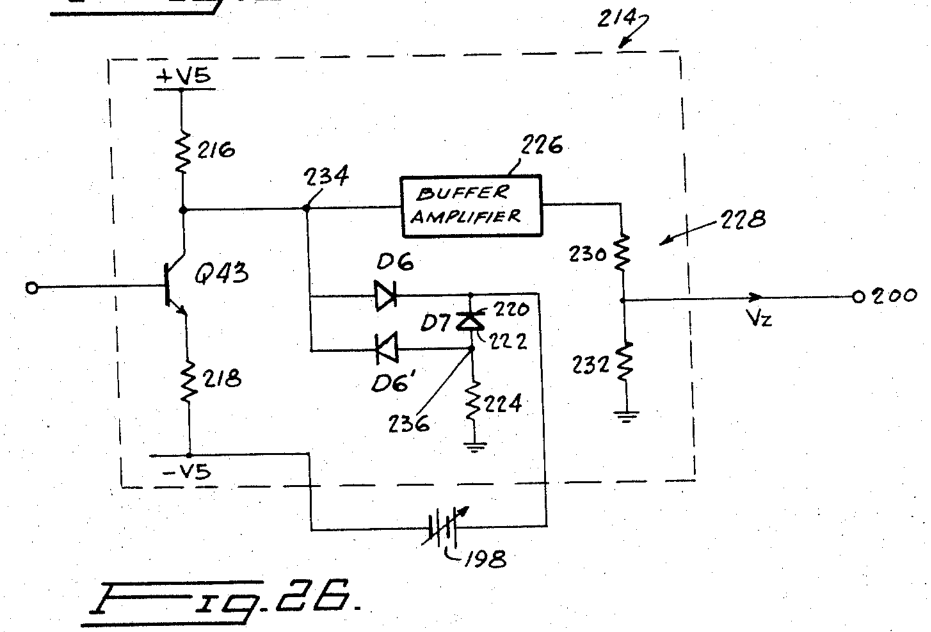
FIGURE 26 shows a circuit for part of the block diagram of FIGURE 25.
Figure 27A:
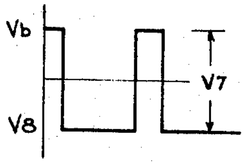
Figure 27B:
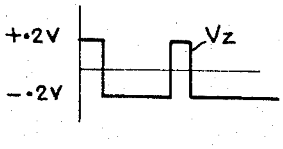
Figure 27C:
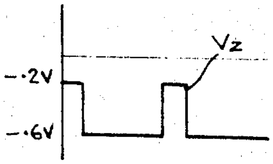
Figure 28:
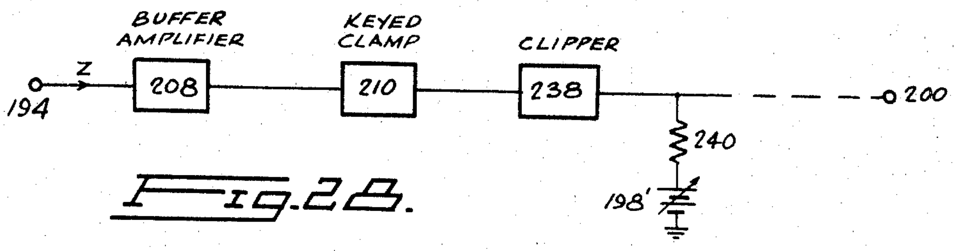
Figures 29, 30:
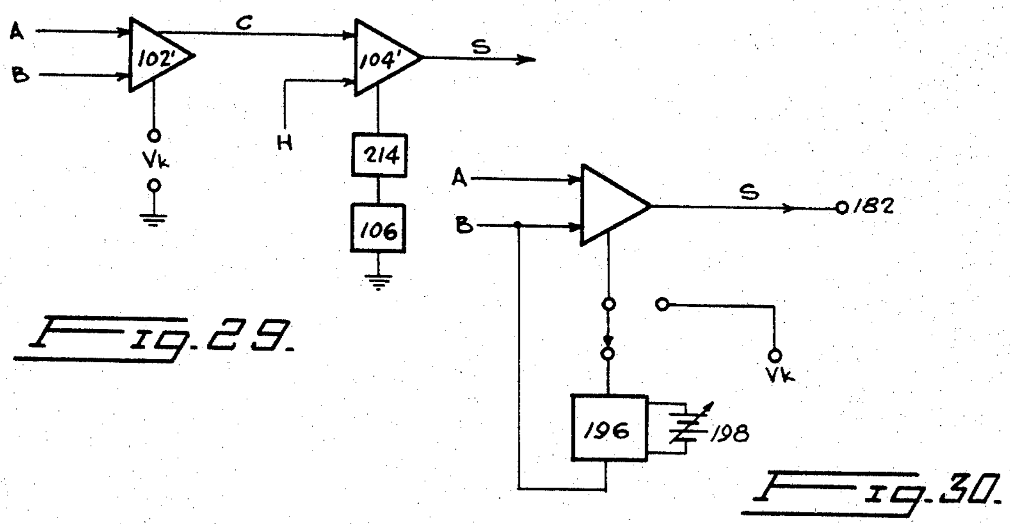

FIGURES 27*a*, 27*b*, and 27*c* show illustrative waveforms obtained with the circuit of FIGURE 26;

FIGURE 28 shows a modification for the arrangement of FIGURE 25;

FIGURE 29 shows a modification of the arrangement of FIGURE 13; and

Figure 23:
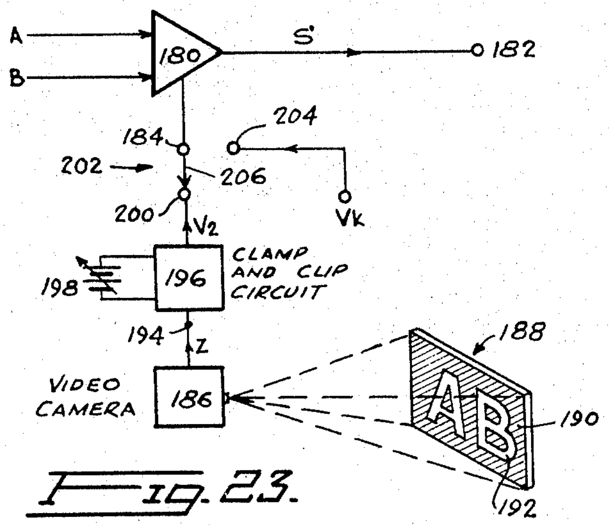
FIGURE 23 is a block diagram for another arrangement for achieving special effects.
Figure 31:
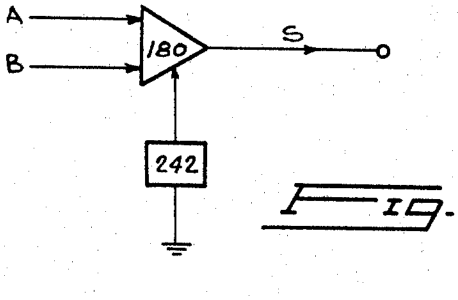

FIGURES 30 and 31 show modifications of the arrangement of FIGURE 23.

Figure 1:
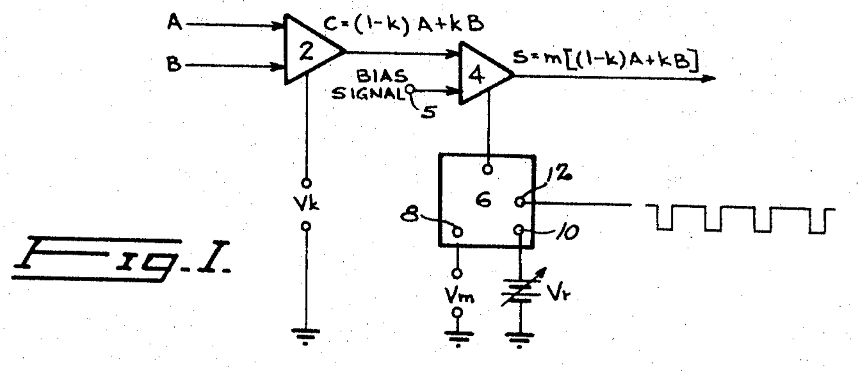
FIGURE 1 is a block diagram for a first arrangement for providing a complementary mix output signal during blanking intervals.

Referring first to the block diagram of FIGURE 1, there is shown a fader amplifier 2 for receiving video input signals A and B and for providing a complementary mix output signal C of the form $$C=(1-k)A+kB$$

Coefficient $k$ assumes values between 0 and 1 dependent upon a control voltage V$k$ applied to amplifier 2.

Signals A and B are each assumed to contain synchronizing information (including blanking and synchronizing pulses) controlled by a synchronizing generator (not shown). The blanking and synchronizing pulses in signals A and B are assumed to be timed sufficiently closely that any timing mismatch between such pulses when signals A and B are combined may be ignored for practical purposes.

The output signal C from amplifier 2 is next directed to one input of another similar amplifier 4, amplifier 4 having another input 5 for an additional biasing signal, the purpose of which will be later explained in more detail. Amplifier 4 has a gain $m$ variable between 0 and 2 dependent upon a control voltage V$m$ applied to amplifier 4, and has an output signal S of the form $$S=m[(1-k)A+kB]$$

It is evident that when $m$ has a value equal to unity, the output signal S will be a complementary mix of input signals A and B. Similarly reduction of $m$ to zero represents a fade of both signals to black, and a value for $m$ of 2 represents an output signal having twice the amplitude of either input signal and containing input signals A and B in proportions determined by coefficient $k$.

A variation in the gain $m$ will vary the amplitude of the synchronizing information in the output signal S, and this is undesirable. Accordingly means are provided for switching the output signal S of amplifier 4 to a complementary mix of input signals A and B during blanking intervals so as to process synchronizing information undisturbed, without affecting the nature of the mix during picture information or non blanking intervals. Such means comprise, in the FIGURE 1 embodiment, a keyed switch 6 to switch gain $m$ to unity during blanking intervals. Switch 6 is provided with two input terminals, an input terminal 8 to which control voltage V$m$ is applied, and an input terminal 10 to which a reference voltage V$r$ is applied. Voltage V$r$ is of such a value that when it is applied to amplifier 4 in place of control voltage V$m$, the gain $m$ of amplifier 4 is unity. Switch 6 is controlled by blanking signals from any convenient properly timed source, the blanking signal being shown as applied to a control terminal 12 of the switch. During non blanking portions of the video signals, switch 6 passes control voltage V$m$ to amplifier 4, but during blanking intervals, switch 6 is switched by the blanking pulses to apply reference voltage V$r$, instead of voltage V$m$, to amplifier 4. Thus during blanking intervals the output signal S reverts to a complementary mix and contains synchronizing information at the correct amplitude, regardless of how control voltage V$m$ affects the nature of the mix during picture portions of the signals.

Figures 2, 3:
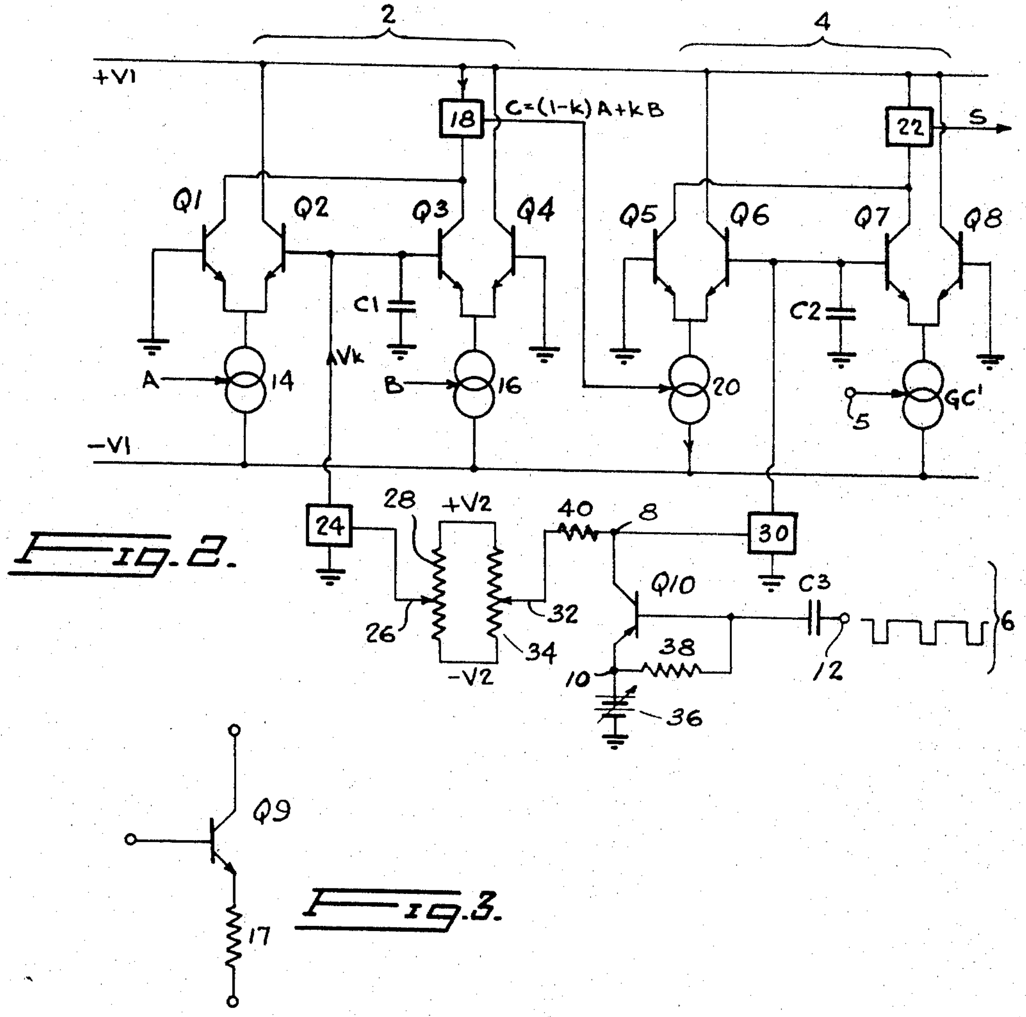
FIGURE 2 shows a circuit for the block diagram of FIGURE 1.
FIGURE 3 shows an input coupling circuit for the circuit of FIGURE 3.

A circuit for the block diagram of FIGURE 1 is shown in FIGURE 2. This circuit is similar to that shown in Kaye and Murray U.S. Patent application Ser. No. 339,216 filed Jan. 21, 1964, Patent No. 3,260,952 issued July 12, 1966 except for the switching arrangement. Referring to FIGURE 2, fader amplifier 2 is shown as comprising a set of four transistors Q1 to Q4 connected in parallel between supply voltages +V1 and −V1. The bases of transistors Q1 and Q4 are directly coupled to ground, while the bases of transistors Q2 and Q3 are grounded at signal frequencies through a capacitor C1, while being biased by the control voltage V$k$. Input coupling circuits 14 and 16 are provided in the emitter circuits of the first pair of transistors Q1 and Q2, and the second pair of transistors Q3 and Q4 respectively, for introducing the signals A and B. Coupling circuits 14 and 16 are conventional high impedance coupling circuits acting essentially as current generators, rather than voltage generators. Each such input coupling circuit is assumed for exemplary purposes to comprise (as shown in FIGURE 3) a transistor Q9 of the same type as transistors Q1 to Q4 (here shown as NPN) having its collector connected to the emitters of transistors Q1 and Q2 (or transistors Q3 and Q4) and its emitter connected through a relatively high resistance 17 to the −V1 supply. The signal, such as signal A or signal B, is applied to the base of transistor Q9. Of course other suitable types of input coupling circuits having a high output impedance may be used if desired.

An output circuit 18 for fader amplifier 2 is connected between the collectors of transistors Q1 and Q3 and the +V1 supply. Output circuit 18 may be simply a resistor or an output transformer, but should be of low impedance, substantialy lower than the output impedance of transistors Q1 and Q3 in parallel.

By varying the control voltage V$k$ through a small range above and below ground potential (about ±0.2 volt) the ratio of the input impedance of transistors Q1 and Q2 can be varied throughout the range from approximately 0 to a very large value tending towards infinity. The current in coupling network 14 will then divide between transistors Q1 and Q2 in the ratio of their impedances, the output at the collector of transistor Q1 being $(1-k)A$ and that at the collector of transistor Q2 being $k$A, where $$k=\frac{1}{1+e^{Vk/Vt}}$$

as is discussed in the Kaye and Murray application referred to. V$t$ is a constant of the transistors at a given temperature.

At the same time the ratio of the input impedances of transistors Q3 and Q4 will be similarly varied (assuming that transistors Q3 and Q4 respond to control voltage V$k$ in identical fashion to transistors Q1 and Q2). Therefore the output at the collector of transistor Q3 is $k$B and the output at the collector of transistor Q4 is $(1-k)B$. The combined output current C at output network 18, being the sum of the output currents of transistors Q1 and Q3, is therefore $$C=(1-k)A+kB$$

It should be noted that the current in coupling circuit 14, which current is being divided between transistors Q1 and Q2, consists not only of video signal A, but also includes a D.C. component A′ generated by circuit 14. Similarly coupling circuit 16 generates a D.C. component B′. Since D.C. components are treated by transistors Q1 and Q4 in the same way as any other frequency, there will appear at output network 18 a D.C. component of the form $(1-k)A'+kB'$. Coupling circuits 14 and 16 will be biased so that components A′ and B′ are equal, in which case the D.C. level in the output will remain constant as coefficient $k$ is varied. Such D.C. components will be referred to from time to time in this description, but such reference is primarily for completeness of explanation of the exemplary circuits described, since in general the D.C. components are not pertinent to the present discussion.

The second fader amplifier stage 4 of the circuit of FIGURES 1 and 2 is similar to the first stage 2, consisting of four transistors Q5 to Q8 connected in the same manner as transistors Q1 and Q4. The output C from the first stage is fed into the emitter circuits of transistors Q5 and Q6 by a high impedance input coupling circuit 20. The bases of transistors Q5 and Q8 are grounded, and the bases of transistors Q6 and Q7 are grounded at video signal frequencies by capacitor C2 while being biased by control voltage V$m$. Transistors Q7 and Q8 are in series with a signal generator GC′ (of form similar to the FIGURE 3 circuit) generating a current C′ equal to the D.C. current C′ produced by input coupling circuit 20. Since this D.C. component is constant, the generator GC′ can be preset by appropriate biasing at its input 5. Generator GC′ is provided so that the D.C. component in the output signal will remain constant as control voltage V$m$ is varied, as will appear shortly.

The current in coupling network 20 now divides between transistors Q5 and Q6 in the ratio of their impedances, the collector current of transistor Q5 being $m$C, plus a D.C. component $m$C′ and the collector current of transistor Q6 being $(1-m)C$, again plus a D.C. component $(1-m)C'$, where $m$ is a coefficient (similar to coefficient $k$) varying between 0 and 1 and given by $$m=\frac{1}{1+e^{Vm/Vt}}$$

Similarly the D.C. current C′ produced by signal generator GC′ divides between transistors Q7 and Q8, transistor Q7 carrying a portion $(1-m)C'$ and transistor Q8 carrying a portion $m$C′

The collectors of transistors Q5 and Q7 are connected to an output circuit 22, the current into output circuit 22 thus being the sum of the collector currents of transistors Q5 and Q7 and being of the form $$mC+mC'+(1-m)C'=mC+C'$$

In order that coefficient $m$ may vary between 0 and 2 (instead of between 0 and 1) in the output signal S from circuit 22, output circuit 22 may conveniently include an amplifier having a fixed two to one gain.

Thus the output video signal from the circuit is $$S=mC$$

where $m$ is a coefficient varying between 0 and 2 dependent upon control voltage V$m$. There is also a D.C. output component C′ which, since it is independent of coefficient $m$, is constant and may be ignored for purposes of the present discussion.

As illustrated ni FIGURE 2, control voltage V$k$ is applied to amplifier 2 (and more specifically to the bases of transistors Q2 and Q3 of amplifier 2) through a conventional low impedance coupling network 24, by means of a fader control arm 26. Fader control arm 26 forms the wiper of a potentiometer 28 connected between supply voltage +V2 and −V2. Similarly control voltage V$m$ is applied to amplifier 4 (i.e. to the bases of transistors Q6 and Q7), through low output impedance coupling circuit 30, by means of fader control arm 32, control arm 32 forming the wiper of another potentiometer 34 also connected between the voltages +V2 and −V2. Keyed switch 6, which may be any conventional switching circuit, is shown as comprising a PNP transistor Q10 having its collector coupled at terminal 8 to wiper 32 and its emitter connected at terminal 10 to a variable D.C. source 36 which provides potential V$r$, the other terminal of source 36 being connected to ground. Blanking pulses are applied at terminal 12 through a capacitor C3 to the base of transistor Q10. A resistor 38 is connected between the base and emitter of transistor Q10. When a blanking pulse is applied to terminal 12 and hence through capacitor C3 to the base of transistor Q10, such pulse drives the transistor deeply into conduction, in effect clamping the potential at terminal 8 at the value V$r$. A resistor 40 is connected in fader arm 32 to limit circulating currents during such clamping. Potential V$r$ is adjusted as previously mentioned to be of a value such that when it is applied through coupling network 30 to the bases of transistors Q6 and Q7, coefficient $m$ is unity. Thus, during blanking intervals, the output signal S is of the form $$S=C=kA+(1-k)B$$

a complementary mix of input signals A and B. This preserves synchronizing information in the output signal at a constant predetermined amplitude independently of the nature of output signal S during non-blanking intervals.

Figure 4:
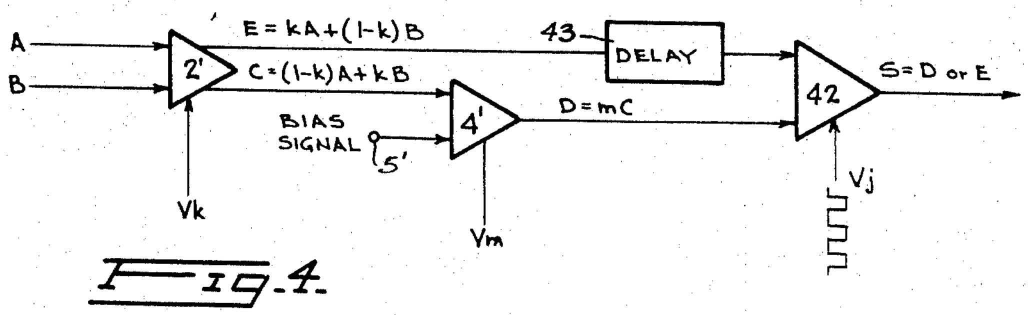
FIGURE 4 is a block diagram for a second arrangement for providing a complementary mix output signal during blanking intervals.

Next, referring to FIGURE 4, there is shown a block diagram for another arrangement of fader amplifiers for providing an output signal S that is a complementary mix of the input signals A and B during blanking intervals, regardless of the nature of the mix during non-blanking intervals, thus to preserve synchronization information at its proper amplitude. The FIGURE 4 arrangement is similar to the FIGURES 1 and 2 arrangements and primed reference numerals denote corresponding elements. However in the FIGURE 4 device, the keyed switch 6 has been removed and instead another fader amplifier 42 of similar nature to amplifier stages 2 and 4 has been placed in the circuit, following the stages 2 and 4. Amplifier 42 now acts as the keyed switch to deliver an output signal S that is of complementary mix form during blanking intervals and any desired form during non-blanking intervals. The delay network 43 serves to time equalize the inputs to amplifier 42.

Figure 5:
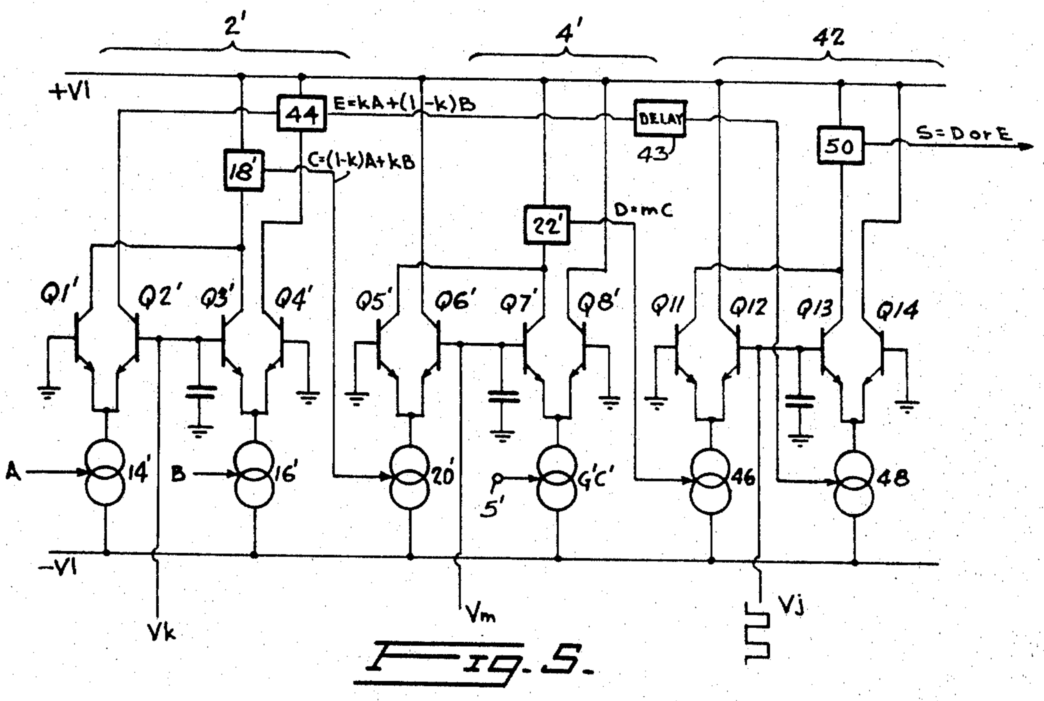
FIGURE 5 shows a circuit for the block diagram of FIGURE 4.

The block diagram of FIGURE 4 is best explained in conjunction with the more detailed illustration thereof shown in FIGURE 5. As shown in FIGURE 5 amplifier 42 comprises four transistors Q11 to Q14 having their collector-emitter elements connected between supply voltages +V1 and −V1. A control voltage V$j$, which is supplied from a source (not shown) of blanking pulses (such source having a low impedance at frequencies down to and including D.C.) is applied to the bases of transistors Q12 and Q13.

Amplifier 2' is now provided with two output circuits, the original output circuit 18', and a second output circuit 44 coupled to the collectors of transistors Q2' and Q4'. Switching amplifier 42 is provided with the two conventional high impedance input circuits, input circuit 46 located in the emitter circuits of transistors Q11 and Q12, and input circuit 48 located in the emitter circuits of transistors Q13 and Q14. Output circuit 44 of amplifier 2' and output circuit 22' of stage 4' are coupled to input circuits 48 and 46 respectively of switching amplifier 42.

An output from the circuit as shown in FIGURE 5 is taken from an output circuit 50 coupled to the collectors of transistors Q11 and Q13.

The operation of the FIGURES 4 and 5 circuit is as follows:

Input signals A and B are supplied to amplifier 2', this amplifier being controlled by control voltage V$k$. As before, amplifier 2' produces at output circuit 18' an output signal C of the form $C=(1-k)A+kB$, and also produces at output circuit 44 a second output signal E of the form $E=kA+(1-k)B$, each of such output signals being a complementary mix of the input signals A and B. Signal C is directed to input 20' of amplifier 4', and amplifier 4' is controlled by voltage V$m$ to produce an output signal now termed signal D, of the form $m$C. Signal D is directed to input circuit 46 of switching amplifier 42 and signal E is directed to the other input circuit of amplifier 42. There will of course also be D.C. components at the various output circuits of the three fader amplifiers shown in FIGURE 5, and it is assumed that these D.C. components are all equal. For simplicity of explanation, it is assumed that, during operation of the arrangement described, the input coupling circuits and the current generators such as GC' are all generating equal D.C. currents.

Amplifier 42, being controlled by control voltage V$j$, yields an output video signal S for the circuit of the form $jD+(1-j)E$ where $j$ is a coefficient similar in form to coefficients $k$ and $m$ and variable between 0 and unity dependent upon control voltage V$j$. Control voltage V$j$ is supplied in pulse form by a convenient source of blanking pulses, so that coefficient $j$ becomes unity during non-blanking intervals (transistors Q11 and Q14 conduct, and transistors Q12 and Q13 are cut off) and so that coefficient $j$ becomes 0 during blanking intervals (transistors Q12 and Q13 conduct, and transistors Q11 and Q14 are cut off). A voltage swing for control voltage V$j$ of about ±.2 volt relative to ground will normally be sufficient for this purpose.

Thus, during non-blanking intervals the output signal S of the circuit of FIGURES 4 and 5 is simply signal D which is a mix that may or may not be complementary, depending on control voltage V$m$. However, during blanking intervals the output signal S is signal E, which is always a complementary mix of the input signals. Therefore the synchronizing information in the output signal is maintained at constant amplitude regardless of how the strength of the picture information portion of the output signal is varied.

Figure 6:
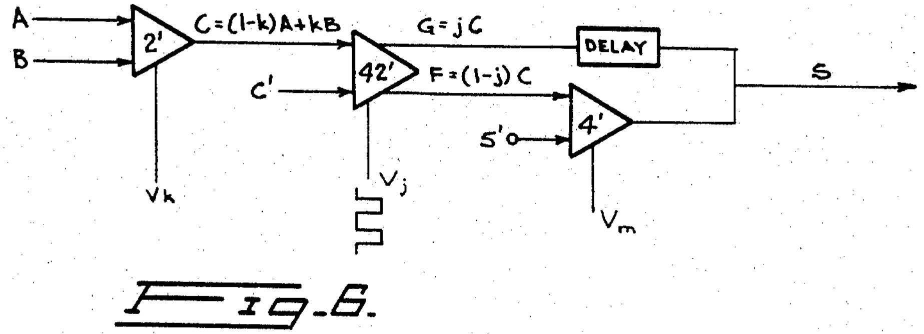
FIGURE 6 is a block diagram for a third arrangement for providing a complementary mix output signal during blanking intervals.
Figure 7:
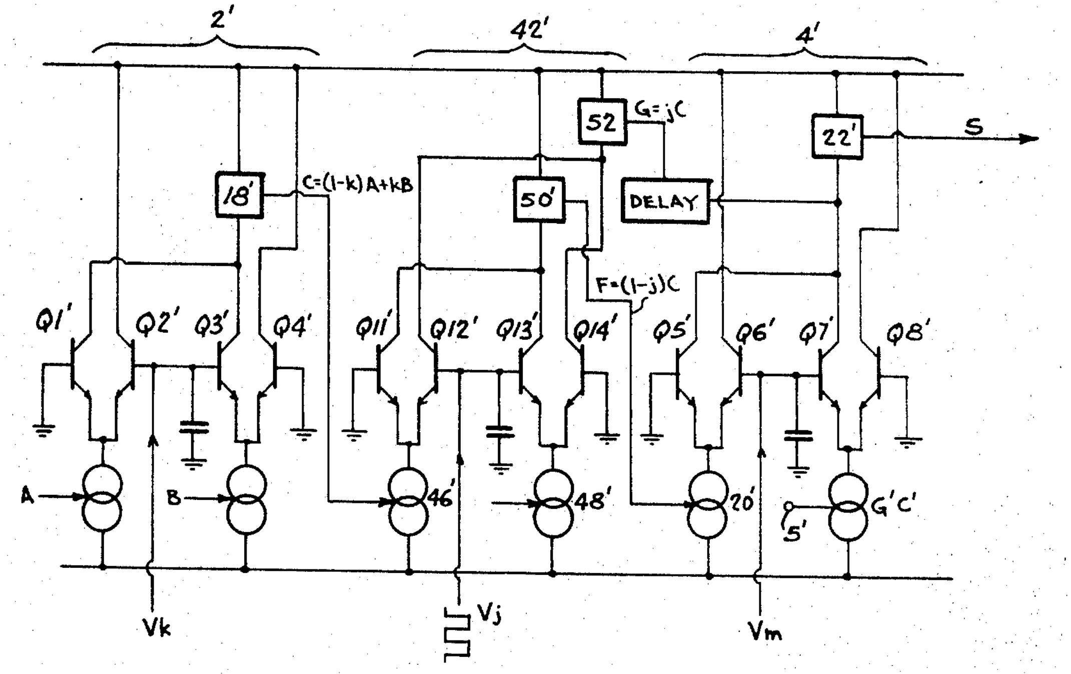
FIGURE 7 shows a circuit for the block diagram of FIGURE 6.

An arrangement somewhat similar to the FIGURES 4 and 5 arrangement is shown in FIGURES 6 and 7, the main difference being that switching amplifier 42 (now numbered 42') is now placed between amplifiers 2' and 4', instead of after both amplifiers 2' and 4' as in FIGURES 4 and 5. In the FIGURES 6 and 7 arrangement, output circuit 18' of amplifier 2' is coupled to input circuit 46' of switching amplifier 42', while into the other input network 48' of switching amplifier 42' is directed a signal appropriate to cause this network to generate a signal C' equal to the D.C. component generated by input circuit 46' (to ensure a constant D.C. level in the output of amplifier 42' regardless of variation in its control voltage V$j$). Output circuit 50' of switching amplifier 42' is coupled to input circuit 20' of amplifier 4'. Switching amplifier 42' is provided with a second output circuit 52 (connected to the collectors of transistors Q12 and Q14) and output circuit 52 is coupled to output circuit 22' of amplifier 4'.

The operation of the circuit of FIGURES 6 and 7 is as follows: Signals A and B are applied to amplifier 2', and amplifier 2' delivers into input circuit 46' of switching amplifier 42' a complementary mix signal $$C=(1-k)A+kB$$

There appears at output circuit 50' of amplifier 42' an output signal $F=(1-j)C$, and also a D.C. output component C', where $j$ is (as before) a coefficient varying between 0 and 1 dependent upon control voltage V$j$. This output is applied to input circuit 20' of amplifier 4'. Similarly there appears at output circuit 52 of amplifier 42' an output signal $G=jC$, and again the D.C. component C', and this output is directed to the output circuit 22' of amplifier 4'.

Control voltage V$j$ is pulsed (by a low impedance source of blanking pulses) so that coefficient $j=1$ during blanking intervals and $j=0$ during non-blanking or picture information intervals. Considering first the blanking intervals when coefficient $j$ is equal to 1, then video signal $F=O$ and signal $G=C$. The output from transistors Q5' and Q7' of amplifier 4' is then $$mF+C'=C'$$

(since signal $F=O$) and this is added to signal $$C+C'$$

flowing from output circuit 52 of amplifier 42'. The resultant video output signal S from circuit 22' for the FIGURES 5 and 6 arangement is therefor (ignoring D.C. components)

$$S=C$$

and since $C=(1-k)A+kB$, hence signal S is a complementary mix of the input signals A and B.

During non-blanking intervals, coefficient $j=0$, so that signal $F=C$ and signal $G=O$. The output from transistors Q5' and Q7' of amplifier 4' is then $$mC+C'$$

and this is added to signal C' flowing from circuit 52. Again ignoring D.C. components, the resultant output signal during non-blanking intervals is $$S=mC=m[(1-k)A+kB]$$

which may or may not be complementary mix, depending on the value of coefficient $m$.

In the result, the output signal S is always a complementary mix of the input signals A and B during blanking intervals, but by control of voltages V$k$ and V$m$ it may be varied as desired during non-blanking intervals.

The circuits so far described have been of a series nature, i.e. input signals were supplied to one fader amplifier stage, and the output of that amplifier was directed to the input of a second fader amplifier stage where further operations were performed upon the signal. Mixing of signals to achieve for example a non-complementary mix can also be performed by a parallel type connection of fader amplifiers, as shown in block diagram in FIGURE 8.

Figure 8:
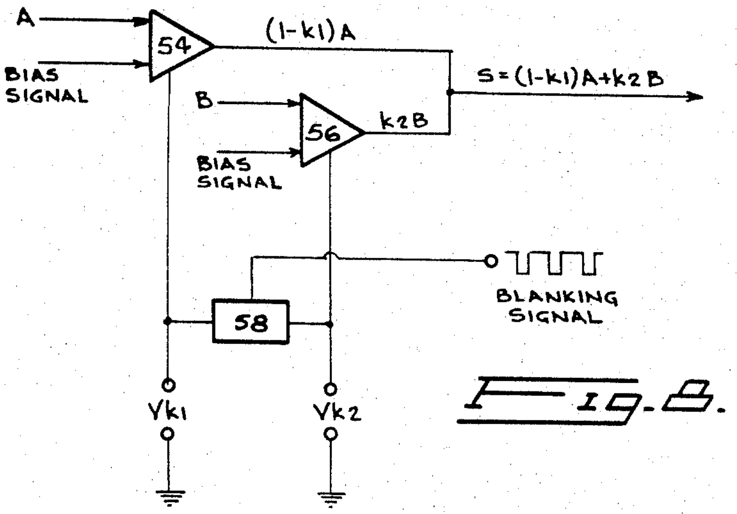
FIGURE 8 is a block diagram for a fourth arrangement for providing a complementary mix output signal during blanking intervals.

In the FIGURE 8 arrangement, a fader amplifier 54 is provided having inputs for signal A and for an appropriate biasing signal. Amplifier 54 is controlled by a control voltage V$k1$ and has an output of the form $(1-k1)$ A where $k1$ is a coefficient variable between 0 and 1 dependent upon the value of control voltage V$k1$. (The output of amplifier 54 also contains an added D.C. component A' which may be ignored for purposes of the present discussion.) Another amplifier 56 similar to amplifier 54 is provided, having inputs for signal B and another biasing signal. Amplifier 56 is controlled by a control voltage $Vk2$ and has an output of the from $k2$B (again plus an added D.C. component B′, adjusted to be equal to component A′) where $k2$ is a coefficient variable between 0 and 1 dependent upon the value of control voltage $Vk2$. The outputs of amplifiers 54 and 56 are added to provide an output signal S of the form $(1-k1)A+k2B$, ignoring the extra D.C. components A′ and B′. Since coefficients $k1$ and $k2$ are independently variable, output signal S may be a complementary or a non-complementary mix of input signals A and B; if $k1$ is equal to $k2$ the mix will be complementary, while if $k1$ is equal to 1 and $k2$ is equal to 0, input signals A and B will be absent from the output S (ingoring D.C. components).

In order that the output signal S will be a complementary mix of the input signals during blanking intervals (regardless of the nature of the mix during non-blanking intervals), thus to preserve synchronization information at its proper amplitude, a keyed switch 58 responsive to blanking signals is provided. Switch 58 is coupled between the inputs for control voltages $Vk1$ and $Vk2$ and is activated by blanking impulses in effect to short circuit the control voltages $Vk1$ and $Vk2$ together during blanking intervals. Since amplifiers 54 and 56 are of the same type, the respective coefficients $k1$ and $k2$ will become equal when control voltages $Vk1$ and $Vk2$ become equal. Thus when switch 58 is activated by blanking pulses to equalize control voltages $Vk1$ and $Vk2$ during blanking intervals, output S becomes a complementary mix of input signals A and B, independently of the form of output signal S during non-blanking intervals.

Figures 9, 10, 11:
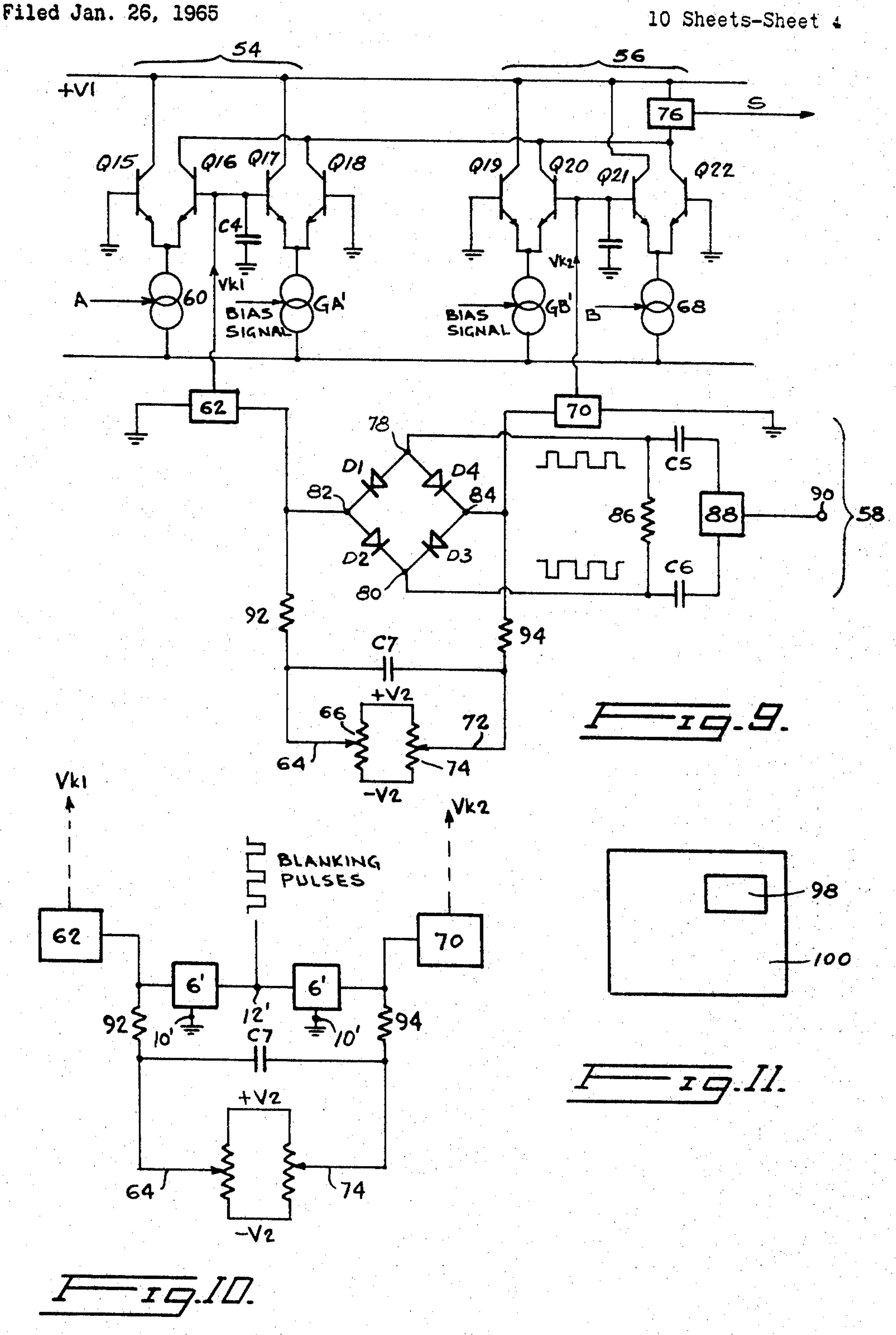
FIGURE 9 shows a circuit for the block diagram of FIGURE 8.
FIGURE 10 shows a modification for a part of the FIGURE 9 circuit.
FIGURE 11 shows a typical special effect television display.

Circuit means in accordance with the block diagram of FIGURE 8 are shown in FIGURE 9. Amplifiers 54 and 56 are each basically similar to amplifiers 2, 4 and 42 already described. Amplifier 54 comprises a set of four transistors Q15 to Q18 having their emitter-collector elements connected in parallel between direct supply voltages +V1 and −V1. Input signal A is introduced into the emitter circuit of transistor Q15 and Q16 by high impedance coupling network 60, while signal generator GA′ in the emitter circuit of transistors Q17 and Q18 generates a current A′ equal to the D.C. component produced by input circuit 60. The bases of transistors Q15 and Q18 are directly coupled to ground while the bases of transistors Q16 and Q17 are coupled to ground at video signal frequencies by capacitor C4 and are biased by control voltage $Vk1$. Control voltage $Vk1$ is supplied, through low impedance coupling network 62, by means of fader control arm 64 which forms the wiper of a potentiometer 66 connected between direct supply voltages +V2 and −V2.

Amplifier 56 comprises a set of four transistors Q19 to Q22 connected in the same manner as transistors Q15 to Q18, input signal B being introduced into the emitter circuit of transistors Q21 and Q22 through high impedance coupling network 68. Signal generator GB′ is located in the emitter circuit of transistors Q19 and Q20 for introducing D.C. signal B′. Control voltage $Vk2$ is applied to the bases of transistors Q20 and Q21, through low impedance coupling network 70, by means of fader control arm 72 which forms the wiper of a potentiometer 74 connected between the direct voltages +V2 and −V2.

The output from amplifier 54, being the collector currents of transistors Q16 and Q18, is added to the output of amplifier 56, i.e. the collector currents of transistors Q20 and Q22, in an output circuit 76, to provide the output signal S.

The keyed switch 58 for equalizing control voltages $Vk1$ and $Vk2$ during blanking intervals will next be described. As shown in FIGURE 9, switch 58 is essentially a ring modulator comprising diodes D1 to D4, diodes D1 and D4 being connected back to back at terminal 78, diodes D2 and D3 being connected back to back at terminal 80, opposite polarity terminals of diodes D1 and D2 being connected together at terminal 82, and opposite polarity terminals of diodes D3 and D4 being connected together at terminal 84. Terminals 78 and 80 of the ring modulator are connected across a load resistor 86 and through capacitors C5 and C6 respectively to a pulse amplifier 88 having an input terminal 90 for blanking pulses. Terminals 82 and 84 of the ring modulator are coupled between fader control arms 64 and 72.

To minimize switching transients when the keyed switch 58 is being operated to equalize fader control voltages $Vk1$ and $Vk2$ (i.e. during blanking intervals), a low pass filter has been shown connected between the fader control arms 64 and 72. This filter comprises a capacitor C7 connected between the control arms, a resistor 92 connected in the circuit between control arm 64 and terminal 82, and another resistor 94 connected between control arm 72 and terminal 84. These resistors 92 and 94 additionally serve to limit circulating current in the fader control arms when they are coupled together by the ring modulator.

In the operation of the FIGURE 9 circuit, control arms 64 and 72 are moved to any desired position for any desired mix of input signals A and B in the output signal S of the circuit. In this condition control voltage $Vk1$ may or may not be equal to control voltage $Vk2$, depending on the respective settings of control arms 64 and 72, and hence coefficient $k1$ may or may not be equal to coefficient $k2$. However, during blanking intervals, blanking pulses, amplified by the pulse amplifier 88, forward bias the diodes D1 to D4, thus shorting terminals 82 and 84 together and forcing control voltages $Vk1$ and $Vk2$ to equality at some new value $Vk3$ dependent upon the settings of control arms 64 and 72 at the time of the blanking pulses. Thus coefficient $k1$ will be equal to the coefficient $k2$ at some new value $k3$ during blanking intervals and the output signal S will be a complementary mix of the input signals A and B during blanking intervals.

It is evident that any means that will equalize control voltages $Vk1$ and $Vk2$ during blanking intervals will accomplish the desired function of switching the output signal S to a complementary mix of the input signals A and B during blanking intervals, thus to process synchronizing information undisturbed at its predetermined amplitude. For example, and as shown in FIGURE 10, two keyed switches 6′, each of the same type as switch 6 shown in FIGURES 1 and 2, may be coupled one to each control arm 64 and 72 (through resistors 92 and 94 respectvely). Terminals 10′ of the switches 6′ may if desired be connected to ground instead of to a reference voltage as in the FIGURES 1 and 2 arrangements. During blanking intervals the potentials at terminals 8′ are clamped to ground thus forcing control voltage $Vk1$ and $Vk2$ to equality as desired. An advantage of the FIGURE 10 arrangement over that of FIGURE 9 is that only a single sided input pulse is required to drive the keyed switches 6′ of FIGURE 9, while in the FIGURE 9 arrangement a split input pulse from the pulse amplifier is required to drive the ring modulator.

An advantage of the FIGURE 9 arrangement over that of FIGURE 10, however, is that during blanking intervals, the FIGURE 9 arrangement will provide a control voltage which is the average of the two control voltages applied during non-blanking intervals. The significance of this is as follows. When fader arms 64 and 72 are both at one extreme (e.g. at the +V2 end of potentiometers 66 and 74) coefficients $k1$ and $k2$ will both be equal to 1 and the video output picture signal from the FIGURE 9 arrangement will be $S=(1-k1)A+k2B=B$. (Similarly, if the arms were at the other extreme, the output would be A.) When the fader arms 64 and 72 are set at the +V2 extreme, so that the output picture is due solely to signal B, then during blanking intervals when the fader arms are shorted together, the arms effectively remain at the +V2 extreme. Therefore all of the synchronizing information in signal A is passed through to the output and the synchronizing information in signal B is suppressed. If the fader arms are both set most of the way toward the +V2 extreme, so that the output signal is a mix consisting mostly of signal B, with a little of signal A, then the synchronizing information in the output will be mostly that of signal B, with a little of that in signal A. In other words, in the FIGURE 9 arrangement the synchronizing information is mixed in substantially the same proportions as the picture information part of the picture, which can lead to improved picture appearance. In the FIGURE 10 arrangement, where during blanking intervals the fader arms 64 and 74 are effectively returned to their centre positions (due to the clamping to ground by switches 6'), the output signal S always contains one half of the synchronizing information from each input signal A and B, regardless of how the picture information parts of signals A and B are mixed.

It should be noted that in the circuits described, whenever an amplifier (such for example as amplifiers 2' and 4' in FIGURE 4) is being switched, the black level of the two input signals to that amplifier must be the same (or differ by a constant) in order to avoid distortion of the output signal. This may be accomplished by clamping or D.C. restoring the signals at the input of the switched amplifier (in the FIGURE 4 circuit, for example, that would mean clamping signals D and E) or if the circuit is D.C. coupled from the input through to the switching amplifier, the clamping may be of the input signals A and B.

It should also be pointed out that the mathematical analysis used in the foregoing discussion is not intended to be exact, but it is illustrative of the operation of the circuits described.

There will next be described another aspect of the invention, useful in achieving special effects in that field of art involving insertion of one television picture display within a selected outline in a background display of another television picture. In television practice, picture inserts are commonly desired to be provided in background displays, a typical example being illustrated in FIGURE 11, where a rectangular shaped insert picture 98 is shown in a background picture 100. In creation of such picture inserts, pattern generators are commonly used to provide a switching signal. The switching signal switches an output signal from one source to another during each scanning line at the point where the transition between the insert and the background is desired to take place. Such special effects as fading of the insert picture into the background picture while fading the background into the insert picture have in the past been difficult to achieve.

Accordingly there is shown in FIGURE 12, in block diagram form, a relatively simple arrangement for achieving special effects involving inserts such as shown in FIGURE 11. The FIGURE 12 arrangement includes a first fader amplifier 102 similar to fader amplifier 2' of FIGURE 4 in that it receives two input signals A and B and is provided with two outputs, one for a signal $$C=(1-k)A+kB$$

and the other for a signal $E=kA+(1-k)B$. Coefficient $k$, as before, varies between 0 and 1 dependent upon control voltage V$k$ applied to amplifier 102.

The two output signals C and E of amplifier 102 are directed to the two inputs of another similar amplifier 104, which is controlled by a control voltage V$n$ to provide an output of the form $(1-n)C+nE$, where $n$ is a coefficient varying between 0 and 1 dependent upon control voltage V$n$. Control voltage V$n$ is supplied from a pattern generator 106, which generates a pulsed voltage sufficient to switch fader amplifier 104 so that coefficient $n$ alternates between values of 0 and 1. In practice, pattern generator 106 will be set to switch coefficient $n$ between values of 0 and 1 at appropriate times during horizontal scanning (thus to switch output signal S between signal C and signal E at such times) to cause an insert containing a picture due to signal C (for example) to appear in a background display of a picture due to signal E. The particular shape of the insert will of course be determined by the setting of the pattern generator, but the insert may be assumed for purposes of illustration to be of the shape shown for insert 98 in FIGURE 11.

In operation of the FIGURE 12 circuit, assume that control voltage V$k$ is adjusted initially so that coefficient $k$ is equal to 0.

In that case signal C will consist solely of signal A, since $C=(1-k)A+kB$, and signal E will consist solely of signal B, since $E=kA+(1-k)B$. In the result, the insert will contain a picture due to signal A alone and the background will contain a picture due to signal B alone.

Next, assume that control voltage V$k$ is gradually varied so that coefficient $k$ slowly increases from its original value of 0 to a new value equal to 1. Then the content of signal C shifts from signal A alone to a mixture of signals A and B and finally to signal B alone, and the picture content of the insert therefore fades from the picture of signal A to the picture of signal B. Simultaneously the content of signal E shifts from signal B alone to a mixture of signals B and A, and finally to signal A alone, so that the picture content of the background fades from the picture of signal B to the picture of signal A. In the result, an interchange of pictures occurs. It will be apparent that the same result may be achieved by supplying voltage V$k$ from a pattern generator and controlling voltage V$n$ by a fader-mixer arm.

An additional special effect may be obtained with the circuit of FIGURE 12 as follows. Assume as before that voltage V$k$ is initially adjusted so that coefficient $k$ is equal to zero, so that signal C consists of signal A alone and signal E consists of signal B. Assume however that control voltage V$n$ is not switched as yet, but instead is held initially at a level which holds coefficient $n$ at a value of 0. The result of these initial conditions is that output signal S will consist of signal C alone, and signal C will consist of signal A alone, so the picture of signal A alone will occupy the entire screen.

Next assume that as voltage V$n$ is held at its initial level to hold coefficient $n$ at a value of 0, control voltage V$k$ is adjusted so that coefficient $k$ slowly shifts from zero to a value of 1/2. At this point signals C and E each include equal parts of signals A and B, and output signal S (which consists of signal C) is a blend of half A and half B. Assume next that with coefficient $k$ held at a value of 1/2, pattern generator 106 is actuated to switch voltage V$n$. Application of this switching voltage will produce no visible effect since it merely causes alternate display of signals C and E, and these are identical to each other (each being a blend of half A and half B).

However if, with pattern generator 106 still actuated, control voltage V$k$ is now adjusted so that coefficient $k$ increases from its value of 1/2 to unity, the content of signal C (and hence of the insert) will shift to signal B alone while the content of signal E (and hence of the background) will shift to signal A alone. The net effect is that of starting with picture A alone, fading from picture A to a mixture of pictures A and B, applying a switching voltage, and then continuing the fade to arrive at an insert of the picture of signal B in a background picture due to signal A. If, after the switching voltage V$n$ where applied, coefficient $k$ were decreased to zero instead of being increased toward unity, the result would be an insert of the picture of signal A in a background picture due to signal B.

If desired, the FIGURE 12 arrangement may be connected as shown in FIGURE 13 (primed reference numerals being used for the fader amplifiers). In FIGURE 13 only one output (here shown as that for signal C) from fader amplifier 102' is directed to an input of fader amplifier 104', and the other input of amplifier 104' is supplied with another video signal H. Control voltage V$n$ is supplied from pattern generator 106 as before. Assuming for example that the picture of signal C represents the insert picture and that of signal H represents the background picture, then the insert picture may be faded from one picture to another by variation of control voltage V$k$ while the background picture remains that of signal H. Control voltage V$n$ could if desired be supplied from an ordinary fader mixer arm, in which case signal S could be made to be a mix of signals A, B and H.

The circuit of FIGURE 13 may be connected as shown in FIGURE 14, in which signal H is constituted simply by signal B. In this arrangement, if control voltage V$k$ is adjusted so that coefficient $k$ is equal to unity, signal C consists solely of signal B, and application of a switching voltage from the pattern generator 106 produces no visible effect on the screen. Now if control voltage V$k$ is adjusted so that $k$ varies from unity towards 0, the content of signal C changes from signal B alone to a mixture of signals B and A and finally to signal A alone, the result being a fading in of an insert picture.

Another arrangement for achieving special effects is shown in FIGURE 15. In this arrangement a pair of parallel fader amplifiers 108 and 110 is provided arranged in a manner similar to amplifiers 54 and 56 of FIGURE 8 but with two outputs taken from each amplifier. Amplifiers 108 and 110 deliver at node 112 a signal X of the form $(1-k)A+k2B$, similarly to the FIGURE 8 circuit (node 112 thus corresponding to output circuit 76 of FIGURE 9). Amplifiers 108 and 110 also deliver at node 114 a signal Y of the form $k1A+(1-k2)B$ (node 114 thus corresponding to an output from the collectors of transistors Q15, Q18, Q19 and Q22 in FIGURE 9). As before, $k1$ and $k2$ are coefficients varying between 0 and 1 dependent upon control voltages V$k1$ and V$k2$. The D.C. components in the outputs of fader amplifiers 108 and 110 are assumed to be equal and may be ignored for purposes of this discussion.

Nodes 112 and 114 are connected to respective inputs of another fader amplifier 116, the switching or special effects voltage V$n$ being applied to amplifier 116 from pattern generator 106. With appropriate adjustment of coefficients $k1$ and $k2$ and switching voltage V$n$, special effects such as reversal of picture subject matter between a background picture and an insert picture may be achieved with the FIGURE 15 arrangement. If signals X and Y represent non-complementary mixes of signals A and B, i.e. if coefficients $k1$ and $k2$ are not equal, then a keyed switch 118 (similar to keyed switch 58 in FIGURE 9) may be provided to equalize control voltages V$k1$ and V$k2$ during blanking intervals.

It will be appreciated that the FIGURE 15 arrangement could be modified so that switching amplifier 116 preceded amplifiers 108 and 110 instead of following them, and somewhat similar special effects could be achieved differing only when the fader arms are split (i.e. spread apart). Such an arrangement (with the fader amplifiers now denoted by primed reference numerals) is shown in FIGURE 16. Switching amplifier 116 is now provided with two outputs, an output for a first output signal X1 of the form $(1-n)A+nB$, and an output for a second output signal Y1 of the form $nA+(1-n)B$. Since coefficient $n$ alternates between 0 and 1 (due to the switching of amplifier 116' by control voltage V$n$), signal X1 will consist of signal A at certain times and signal B at other times. Signal Y1 will consist of signal B when signal X1 consists of signal A, and will consist of signal A when signal X1 consists of signal B. There will also be a D.C. component present in each of the two outputs of amplifier 116, and these D.C. components are as usual assumed to be equal.

Signal X1 is directed into one input of amplifier 108', and an appropriate bias signal is directed into the other input of amplifier 108' (to assure a constant D.C. level in the output of amplifier 108).

Similarly signal Y1 is directed to one input of amplifier 110' and another bias signal is directed to the other input of amplifier 110', to assure a constant D.C. level in the output of this amplifier.

Consider now the situation at a particular instant during a scanning line. Assume that this instant corresponds to a point located on the horizontal line within the insert picture 98, and that coefficient $n=0$ at this time (so that signal X1 consists of signal A alone and signal Y1 consists of signal B alone at this instant). Further assume that coefficients $k1$ and $k2$ are both initially set to zero so that output signal S consists of signal X1 alone. In that case signal S will consist solely of signal A at this instant under consideration, i.e. the insert picture will be that of signal A (and the background picture will be that of signal B). Now, assume that with the horizontal scanning "stopped," i.e. still at this particular point on the horizontal scanning line, coefficients $k1$ and $k2$ are both increased to a value of 1. Now signal S will consist of signal Y1 alone, and signal Y1 will (at this given instant) consist of signal B alone, so that the picture subject matter of the insert will be that of signal B. In short, the picture content of the insert will have been faded from A to B (and that of the background will have been faded from B to A).

Figure 17:
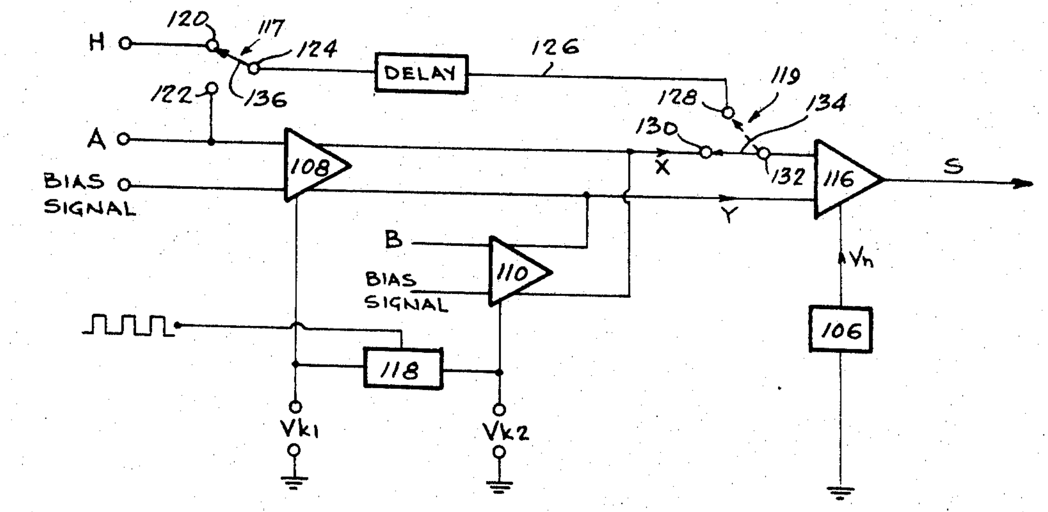
FIGURE 17 shows another modification of the arrangement of FIGURE 15.

The FIGURE 15 arrangement may also be connected as shown in FIGURE 17, where two selector switches 117 and 119 are illustrated. Selector switch 117 includes three terminals, terminal 120 connected to receive a third input signal H (in addition to signals A and B), terminal 122 connected to the signal A input of amplifier 108, and a terminal 124 connected through a lead 126 to a terminal 128 of switch 119. Switch 119 also has three terminals, terminal 128 as mentioned, terminal 130 connected to the signal X output of amplifiers 108 and 110, and terminal 132 connected to one input of amplifier 116. Arm 134 of switch 119 is connected to terminal 132 and is movable between terminals 128 and 130, while an arm 136 of switch 117 is connected to terminal 124 of switch 117 and is movable between terminals 120 and 122.

With arms 134 and 136 in the position shown in solid lines in FIGURE 17, the FIGURE 17 arrangement functions exactly like the FIGURE 15 arrangement, and it will perform substantially all of the functions of the FIGURE 12 arrangement. If however arm 134 is moved to the position shown in dotted lines (where it contacts terminal 128), then one of the inputs to switching amplifier 116 becomes signal H, while the other input remains signal Y, signal Y being a mix of signals A and B. If signal Y represents the insert picture, then the subject matter of the insert can be faded from A to B or vice versa, without affecting the background picture due to signal H. Therefore, with switch arm 134 contacting terminal 128 and switch arm 136 contacting terminal 120, the FIGURE 17 circuit performs the functions of the FIGURE 13 arrangement and in addition allows the insert picture (for example) to be a non-complementary mix of signals A and B. Of course the FIGURE 17 arrangement also allows fading to black or other operations on the background picture without affecting the insert picture. as does the FIGURE 13 arrangement.

If now, with switch arm 134 still contacting terminal 128, switch arm 136 is moved to contact terminal 122, then one of the inputs to switching amplifier 116 becomes signal A, while the other input (signal Y) remains a mix of signals A and B. When the switches are in this position, therefore, the FIGURE 17 circuit performs the functions of the arrangement of FIGURE 14 and in addition provides for non-complementary mixes. It may be seen, therefore, that the FIGURE 17 arrangement is a versatile circuit. It should again be stressed that input signals A, B and H are all assumed to be clamped or D.C. restored before they are supplied to the fader amplifiers.

Figure 18:
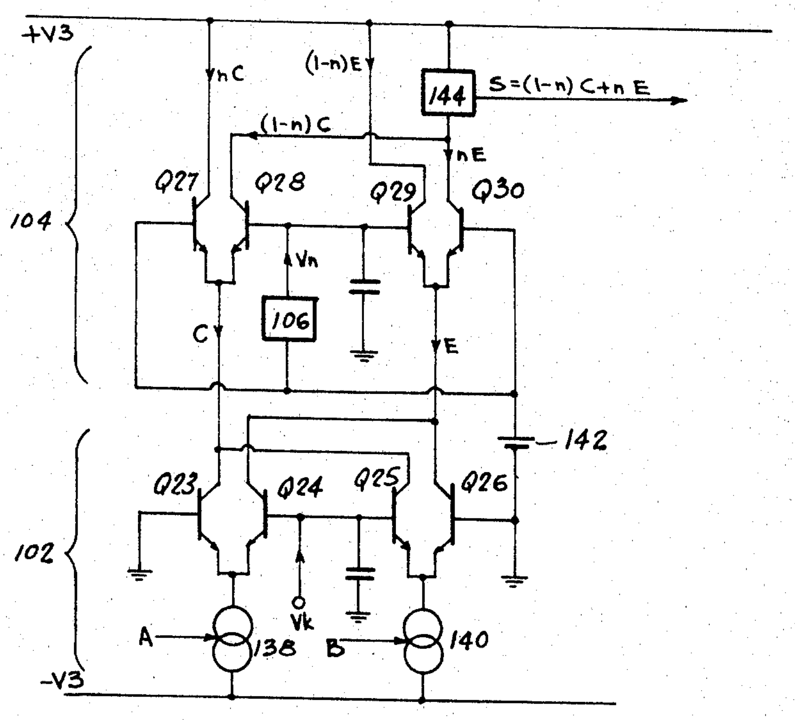
FIGURE 18 shows a circuit for the block diagram of FIGURE 12.

Although circuits in accordance with the block diagrams of FIGURES 12 to 17 may be built in a manner similar to the circuits shown in FIGURES 2, 5, 7 and 9, they may also be built so as to be directly coupled, as will now be described. Reference is first made to FIGURE 18, which shows a circuit for the block diagram of FIGURE 12.

In FIGURE 18 fader amplifier 102 is shown as comprising four similar transistors Q23 to Q26 connected together in a manner similar to that of transistors Q1 to Q4 of FIGURE 2. The emitters of transistors Q23 and Q24 are connected through a high impedance input coupling circuit 138 to a negative supply —V3, while the emitters of transistors Q25 and Q26 are similarly connected through another high impedance input coupling 140 to the —V3 supply. Control voltage V*k* is applied to the bases of transistors Q24 and Q25 while the bases of transistors Q23 and Q26 are grounded. The collectors of transistors Q23 and Q25 are connected together and to the emitters of transistors Q27 and Q28 of following fader amplifier 104. The collectors of transistors Q24 and Q26 are similarly connected together and to the emitters of transistors Q29 and Q30 of amplifier 104. Transistors Q27 to Q30 are all of the same polarity (here shown as NPN) as transistors Q23 to Q26.

It will be noted that the circuit from the emitters of transistors Q27 and Q28 through the collectors of transistors Q23 and Q25 and through coupling circuits 138 and 140 respectively constitutes in effect a current generator input to the emitters of transistors Q27 and Q28, as is required. Similarly the circuit through the collectors of transistors Q24 and Q26 and through coupling circuits 138 and 140 constitutes the current generator input necessary to drive transistors Q29 and Q30.

The bases of transistors Q27 and Q30 are connected to ground through a low impedance D.C. source 142, while control voltage *Vn* is applied to the bases of transistors Q28 and Q29 from pattern generator 106, generator 106 being referenced to source 142. Source 142 assures that the emitters of transistors Q27 and Q30, and hence the collectors of transistors Q23 to Q26, may be positive with respect to the bases of transistors Q23 to Q26 (depending of course upon control voltage V*k*) so that transistors Q23 to Q26 can conduct.

The operation of the FIGURE 18 circuit is essentially similar to that of the FIGURE 2 circuit. The output signal C at the collectors of transistors Q23 and Q25, such signal being of the form $C=(1-k)A+kB$, divides between transistors Q27 and Q28 as determined by control voltage *Vn*, the output at the collector of transistor Q27 being *n*C and the output at the collector of transistor Q28 being $(1-n)C$. The output signal E at the collectors of transistors Q25 and Q26, such signal being of the form $E=kA+(1-k)B$, divides similarly between transistors Q30 and Q29, the signal at the collector of transistor Q30 being *n*E and that at the collector of transistor Q29 being $(1-n)E$. The signals at the collectors of transistors Q28 and Q30 are added in output circuit 144 to provide an output signal S of the form $S=(1-n)C+nE$. Control voltage V*n* may be rapidly switched, as mentioned, so that coefficient *n* is switched between values of zero and unity.

Figure 19:
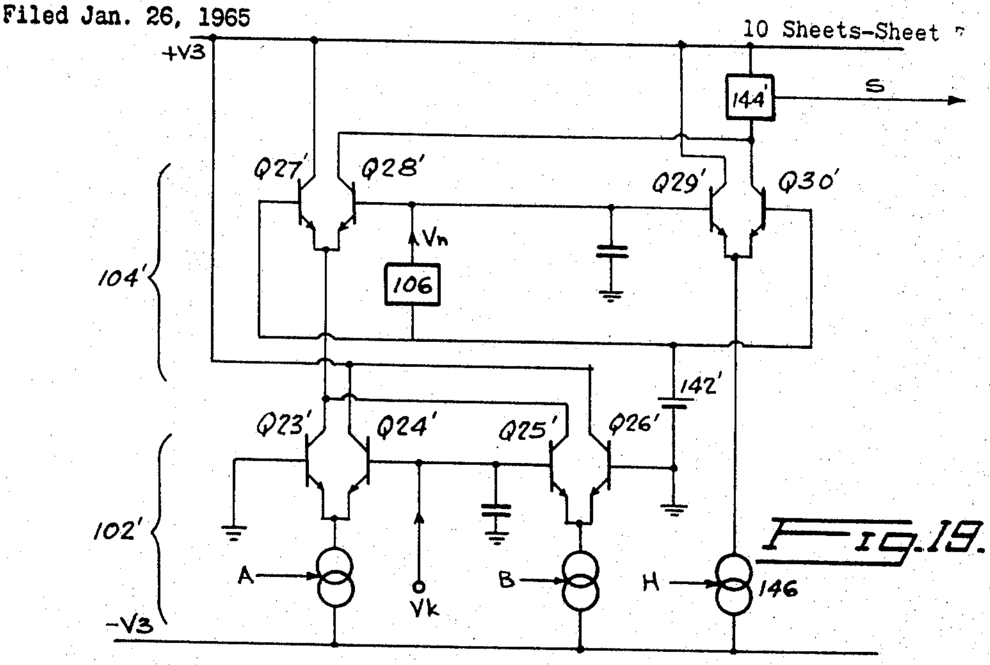
FIGURE 19 shows a circuit for the block diagram of FIGURE 13.

A modification of the FIGURE 18 circuit is shown in FIGURE 19, primed reference numerals indicating corresponding parts. The difference between the FIGURES 18 and 19 arrangements is that in FIGURE 19 the emitters of transistors Q29′ and Q30′ are connected to a conventional high impedance input coupling circuit 146 instead of being connected to the collectors of transistors Q24′ and Q26′. The collectors of transistors Q24′ and Q26′ are now connected directly to the +V3 supply. FIGURE 19 thus shows a circuit for the block diagram of FIGURE 13.

Figure 20:
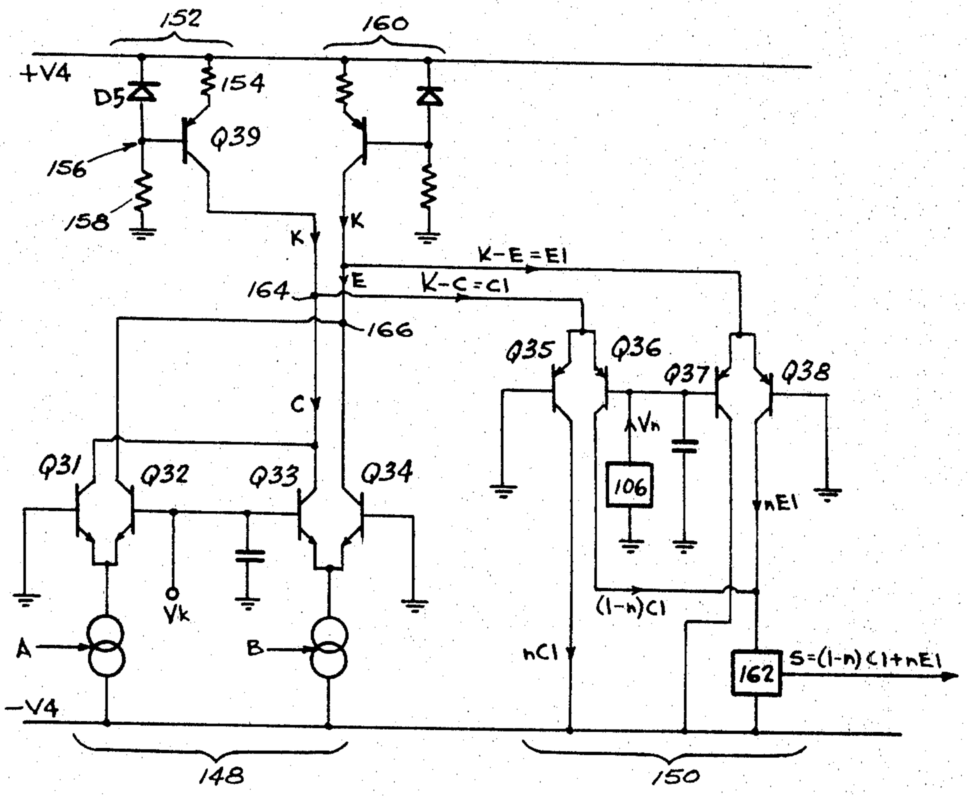
FIGURE 20 shows another circuit for the block diagram of FIGURE 12.

Referring next to FIGURE 20, there is shown a circuit similar to that of FIGURE 19 but requiring a somewhat lower voltage supply. In the circuit of FIGURE 20 a first fader amplifier 148 is shown as comprising four NPN transistors Q31 to Q34 inclusive connected together in a manner generally similar to the connection of transistors Q23 to Q26 of fader amplifier 102 in FIGURE 18. However the collectors of transistors Q31 and Q33 are connected to a voltage supply +V4 through a constant current generator indicated generally at 152. Current generator 152 comprises a PNP transistor Q39 having its collector connected to the collectors of transistors Q31 and Q33, its emitter connected through a resistor 154 to the +V4 supply, and its base connected to a voltage divider indicated generally at 156. Voltage divider 156, which comprises a Zener diode D5 and a resistor 158 connected in series between the +V4 supply and ground, assures a constant potential at the base of transistor Q39 so that this transistor will provide a constant current.

The collectors o ftransistors Q32 and Q34 are similarly connected to the +V4 supply through a current generator 160 similar to generator 152.

The circuit of FIGURE 20 includes in addition to fader amplifier 148, a second fader amplifier 150. Amplifier 150 is similar to amplifier 104 of FIGURE 18 but comprises transistors opposite in polarity to those of fader amplifier 148, the transistors Q35 to Q38 of amplifier 150 being PNP instead of NPN. In the manner of the FIGURE 18 circuit, the collectors of transistors Q31 and Q33 are connected to the emitters of transistors Q35 and Q36, while the collectors of transistors Q32 and Q34 are connected to the emitters of transistors Q37 and Q38.

The collectors of transistors Q35 and Q37 are connected to a supply voltage —V4, while the collectors of transistors Q36 and Q38 are connected through an output circuit 162 to the —V4 supply.

For purposes of description of the operation of the FIGURE 20 circuit, the point common to the collectors of transistors Q31 and Q33, the emitters of transistors Q35 and Q36, and current generator 152, may be termed node 164. Similarly the point common to the collectors of transistors Q32 and Q34, the emitters of transistors Q37 and Q38, and current generator 192, may be termed node 166.

The collectors of transistors Q31 and Q33, connected to node 164, represent a high impedance current generator withdrawing from node 164 a current C of the same form as is given for signal C in the FIGURE 18 arrangement. In other words, current C is of the form $(1-k)A+kB$, and its magnitude at any given instant depends upon signals A and B and control signal V*k* applied to the bases of transistors Q32 and Q33. Generator 152 delivers into node 164 a constant current K. The difference between these currents, i.e. a current K–C, is delivered to the emitters of transistors Q35 and Q36 for sharing in accordance with the dictates of control signal *Vn* (applied to the bases of transistors Q36 and Q37). Since current K is constant, current K–C may be rewritten as current C1 (where current C1 is of opposite phase to current C). Thus the collector current of transistor Q35 will be of the form *n*C1 and that of transistor Q36 will be of the form $(1-n)C'$ where as before *n* is a coefficient variable between zero and unity dependent upon control voltage V*n*.

Similarly transistors Q32 and Q34 withdraw from node 166 a current E of the same form as is given for signal E in the FIGURE 18 arrangement. Current E is thus of the form $kA+(1-k)B$, and its magnitude at any given instant depends upon signals A and B and upon control voltage V*k*. Generator 160 delivers into node 166 a current K of the same value as that produced by generator 152. The difference between currents K and E, i.e. current K—E′, which may be rewritten as current E1, is delivered to the emitters of transistors Q37 and Q38 for sharing as dictated by control signal V*n*. Thus the collector current of transistor Q38 will be of the form *n*E1 and that of transistor Q37 will be of the form $(1-n)$E1.

In the result, the output signal S from output circuit 162 will be of the form $(1-n)C1+nE1$, similar to the output from the FIGURE 18 circuit.

Figures 21, 22:
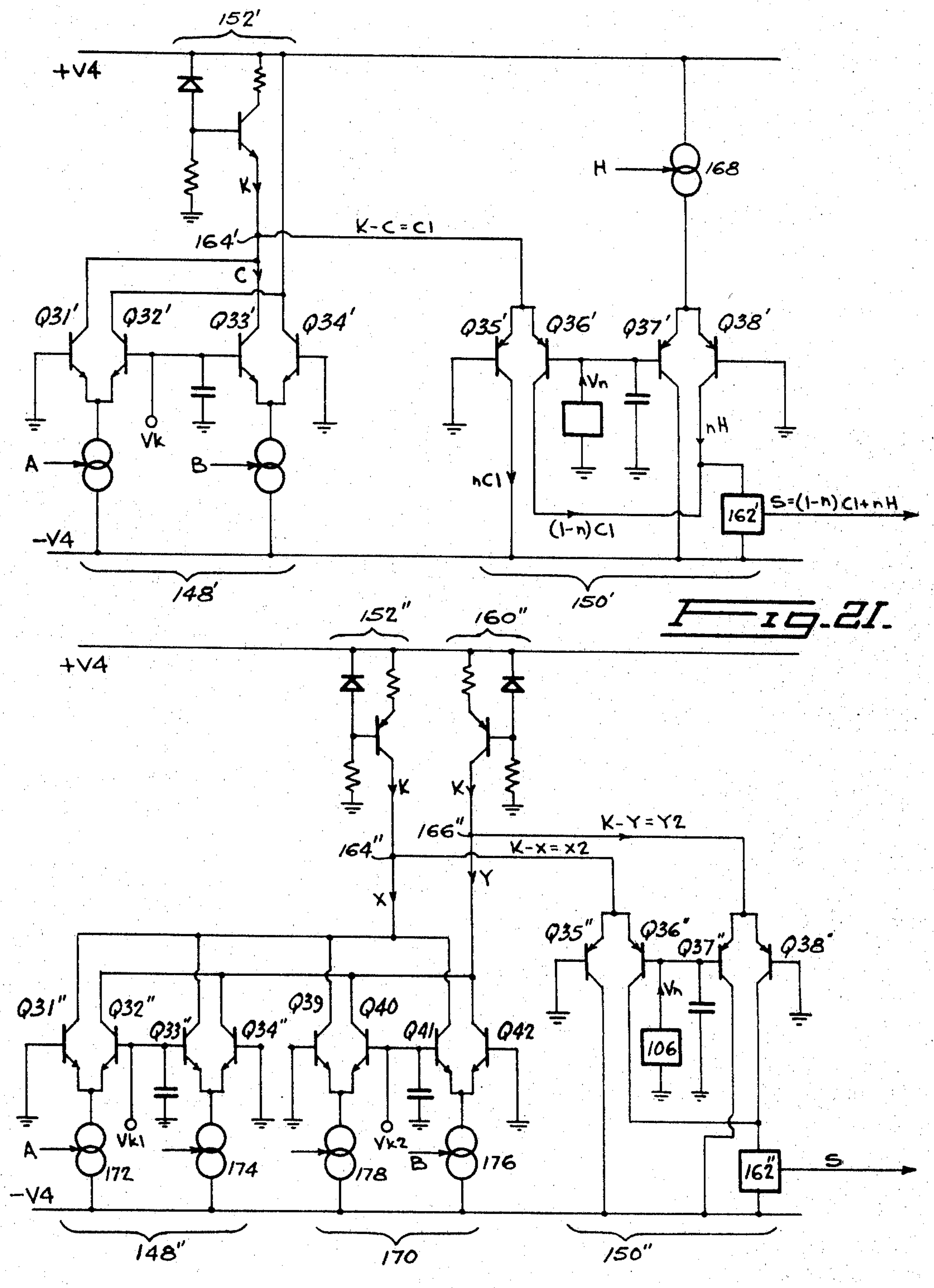
FIGURE 21 shows another circuit for the block diagram of FIGURE 13.
FIGURE 22 shows a circuit for the block diagram of FIGURE 15.

The circuit of FIGURE 21 is similar to that of FIGURE 20 and primed reference numerals are used to indicate elements corresponding to those in FIGURE 20. The difference between the two circuits is that in the FIGURE 21 arrangement current generator 160 has been removed, the collectors of transistors Q32′ and Q34′ being connected directly to the +V4 supply. The current input to the emitters of transistors Q37′ and Q18′ is now supplied from a current generator 168 generating a current proportional to signal H applied thereto. The FIGURE 21 circuit is thus (like the FIGURE 19 circuit) a circuit arrangement for a part of the block diagram of FIGURE 13, fader amplifiers 148′ and 150′ of FIGURE 21 corresponding to amplifiers 102′ and 104′ respectively of FIGURE 13. As mentioned, the FIGURE 13 arrangement enables one input to the second fader amplifier to be a mix of signals A and B (from the first fader amplifier) while allowing the other input to the second fader amplifier to be an entirely separate signal H.

Reference is next made to FIGURE 22, which shows a circuit similar to that of FIGURE 20 (double primed reference numerals denote corresponding elements) but which is suitable for performing the functions of the block diagram of FIGURE 15. The FIGURE 22 circuit includes a first fader amplifier 148″ (which corresponds to amplifier 108 of FIGURE 15) connected to current generators 152 and 160 in the same manner as described for amplifier 148 of FIGURE 20. Amplifier 148″ is also connected to switching amplifier 150″ (which corresponds to amplifier 116 of the FIGURE 15 block diagram) in the same manner as is described for the FIGURE 20 circuit.

The difference between the FIGURES 20 and 22 circuits is that in FIGURE 22, another fader amplifier 170 is provided, having NPN transistors Q39 to Q42 connected in a similar manner to transistors Q31″ to Q34″ of amplifier 148″. Signal A is applied to input coupling circuit 172 of amplifier 148″, while circuit 174 generates a current A′ equal to the D.C. component produced by circuit 172. Signal B is applied to input circuit 176 of amplifier 170 while circuit 178 generates a current B′ equal to the D.C. component produced by circuit 176. Currents A′ and B′ are of course equal.

Control voltages V$k1$ and V$k2$ are applied to the amplifiers 148″ and 170 respectively. Keyed switch 118 of the FIGURE 15 arrangement is not illustrated in the FIGURE 22 circuit since it has already been fully discussed in connection with FIGURES 9 and 10.

In the operation of the FIGURE 22 circuit, transistor Q31″ withdraws current $(1-k1)A+(1-k1)A'$ from node 164, transistor Q33 withdraws current $k1$A′, transistor Q39 withdraws current $(1-k2)B'$, and transistor Q41 withdraws current $k2B+k2B'$, where coefficients $k1$ and $k2$ are variable between 0 and 1 by control voltages V$k1$ and V$k2$ respectively. Thus the total current withdrawn from node 164″ is $(1-k1)A+k2B$ (plus D.C. components which may be ignored), so that the current withdrawn from node 164″ is simply current X, of the form $(1-k1)A+k2B$. The current directed to the emitters of transistors Q35″ and Q36″ of switching amplifier 150″ is $K-X$, which may be rewritten as current X2. Current X2 is opposite in phase to current X. It may be seen that node 164″ of FIGURE 22 corresponds substantially to node 112 in FIGURE 15.

Similarly amplifiers 148″ and 170 withdraw from node 166″ a current Y of the form $k1A+(1-k2)B$, so that the current remaining to be directed to the emitters of transistors Q37″ and Q38″ is K—Y, which may be rewritten as current Y2. Node 166″ thus corresponds to node 114 of FIGURE 15.

Current X2 is shared between transistors Q35″ and Q36″ as dictated by control signal (i.e. switching signal) V$n$, and current Y2 is similarly shared between transistors Q38″ and Q37″. The resulting output signal S, taken from the collectors of transistors Q36″ and Q38″, is of the form $(1-n)X2+nY2$, and since coefficient $n$ alternates between 0 and 1, the content of output signal S alternates between signals X2 and Y2. For added versatility, the selector switches shown in FIGURE 17 may be connected in the FIGURE 22 circuit.

It has so far been assumed that a pattern generator would be used to generate the special effects or switching voltage V$n$ discussed in connection with FIGURES 12 to 22. However it will be apparent that a video camera instead may be used to provide a special effects switching signal useful for creating picture inserts, provided that the camera scans a scene of appropriate content. Such a camera may be used in any of the arrangements described, and a further exemplary arrangement is shown in FIGURE 23, where there is illustrated a fader amplifier 180 of the same type as fader amplifier 2 of FIGURE 2. Amplifier 180 has two inputs, for video signals A and B respectively, the input signals as usual being assumed to be clamped (or D.C. restored) prior to their application to amplifier 180.

An output signal S is taken from output terminal 182 of the amplifier, the output signal containing proportions of signals A and B as determined by the control voltage applied to control voltage input terminal 184.

A video camera 186 is provided for generating a control voltage to be applied to control voltage input terminal 184. Camera 186 scans a scene generally indicated at 188 and containing an object having an outline of the same shape as the shape of the insert desired to be inserted into the background picture, the object being strongly contrasted against a background 190. This object may for example consist of a pattern of letters 192 strongly contrasted against the background 190, the letters 192 being for example white and the background 190 black (the black being denoted by cross hatching in FIGURE 23). Alternatively, the object in the scanned scene may be any animate or inanimate object, still or moving, provided a sufficiently strong contrast will exist between the strength of the video signals produced in scanning the object and the background respectively. Normally the outline of the object will be made as sharp as possible.

As the camera scans a scene such as scene 188, a pulsed video signal Z is produced, the voltage of signal Z having a black level value when the black background 190 is being scanned and having a white level value when white letters 192 are being scanned.

Signal Z is applied to the input terminal 194 of a clamp and clip circuit generally indicated at 196, circuit 196 being provided with a variable bias source 198 for a purpose shortly to be discussed. The output terminal 200 of clamp and clip circuit 196 constitutes a fixed terminal of a switch 202, switch 202 having another fixed terminal 204, and also having a movable arm 206 connected to control voltage input terminal 184. In the position for switch 202 shown in FIGURE 23, arm 206 contacts terminal 200 so that the output signal from clamp and clip circuit 196, such output signal now being termed control voltage V$z$, may be applied to control voltage input terminal 184. If it is desired to use amplifier 180 as a simple fader amplifier merely to mix signals A and B, then arm 206 may be moved to terminal 204 to which a fader control voltage V$k$ may be applied.

Clipping and clamping circuit 196 serves to provide accurate control of the control voltage V$z$ applied to fader amplifier 180. Clamping of signal Z (commonly by a conventional keyed clamp) ensures that no changes in the D.C. level of the peaks of control voltage V$z$ will occur when for example white portions of video signal Z vary in duration. (D.C. restoration of signal Z will also suffice for this purpose.) Clipping of the clamped signal ensures that the pulses contained therein will be of optimum amplitude to switch fader amplifier 180.

The usual synchronizing means are assumed present (although not shown) for synchronizing video signals A, B and Z.

In operation the circuit of FIGURE 23 functions as follows. Assume for purposes of illustration that fader amplifier 180 requires a control voltage of +.2 volt to switch it so that output signal S consists of signal B alone and a control voltage of —.2 volt to switch it so that output signal S consists of signal A alone. In such a case circuit 196 is adjusted so that when black background 190 is being scanned by camera 196, voltage Vz will have a value of —.2 volt and thus during scanning of background 128, signal S will consist of signal A alone. Circuit 196 is further adjusted so that when white letters 192 are being scanned, voltage Vz will have a value of +.2 volt and thus during scanning of letters 192, signal S will consist of signal B alone.

In the result, the content of output signal S of the fader amplifier 180 is switched back and forth between signals A and B at a rate appropriate to cause insertion of picture information in signal B within the outlines of letters 192 in the picture display of signal A.

Figure 24:
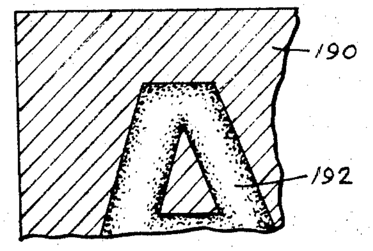
FIGURE 24 shows a modification of a part of the arrangement of FIGURE 23.

As previously mentioned, the borders of letters 192 (or any other objects used) will normally be made as sharp as possible. However the borders may if desired be such as to blend into the background as shown diagrammatically in FIGURE 24, so that progressing from the letters 192 to the background 190, the luminance level changes for example from white to a darkening grey to black. When such a blended border is used instead of the sharply defined border shown in FIGURE 23, the borders of the picture insert produced by the circuit of FIGURE 23 will be a blend of the picture information in signals A and B.

The insert picture may be faded away over an interval of time into the main picture display of signal A (or vice versa) by control of bias source 198. This process is best understood with reference to FIGURES 25 to 27 where a more detailed illustration of clamping and clipping circuit 196 is shown, along with illustrative waveforms.

In FIGURE 25, clamping and clipping circuit 196 is shown as comprising a buffer amplifier 208, followed by a keyed clamp 210 (or other means for D.C. restoration) another buffer amplifier 212, and an amplifier and clipping stage 214. Buffer amplifier 208 has a high input impedance as is commonly required by the preceding video circuitry and a low output impedance suitable for driving the keyed clamp 210. Buffer amplifier 212 has the high input impedance commonly required to follow a conventional clamp.

The amplifier and clipping stage 214 is shown in more detail in FIGURE 26. Stage 214 comprises a transistor Q43 having collector and emitter resistors 216 and 218 respectively leading to sources of potential +V5 and —V5 respectively. (Potentials +V5 and —V5 need not be equal.) Diodes D6 and D6′ have their anode and cathode respectively connected to the collector of transistor Q43, the cathode and anode of diodes D6 and D6′ respectively being connected to the positive and negative terminals 220 and 222 respectively of a Zener diode D7. The negative terminal 222 of Zener diode D7 is connected through a resistor 224 to ground while the positive terminal 220 of diode D7 is connected to variable bias source 198, source 198 being here shown as a variable D.C. power supply connected to the negative source —V5 and producing a bias voltage V*b* variable above and below ground. A direct coupled buffer amplifier 226 connected to the collector of transistor Q43 drives an attenuator 228 consisting of resistors 230 and 232, the output of attenuator 228 being connected to fixed terminal 200 of switch 202. Points 234 and 236 are reference points.

In the operation of the circuit of FIGURES 25 and 26, video signal Z is clamped in the keyed clamp 210, and this clamped signal is then applied (through buffer amplifier 212) to the base of transistor Q43. Preferably sufficient amplification occurs in buffer amplifier 212 and in transistor Q43 so that the signal appearing at reference point 234 would have (in the absence of diodes D6 and D6′) a peak to peak voltage of about five volts, in order that satisfactory clipping may be achieved. Then the positive extremities of the signal at point 234 above the voltage V*b* of source 198 are clipped by diode D6, as shown in FIGURE 27*a*. Due to Zener diode D7, point 236 remains at a potential V7 below point 234, where V7 is the voltage drop across the Zener diode D7, so that diode D6′ clips any negative excursions of the signal at point 234 below a voltage V8, where $V8=Vb-V7$. The resulting waveform at point 234 is shown in FIGURE 27*a*, where the amplitude of the train of pulses is V7 volts. Since the voltage V7 will probably be considerably larger than the .4 volt swing assumed sufficient to switch fader amplifier 180, attenuator 228 provides suitable attenuation and prevents overdriving of the fader amplifier 180, the resultant control voltage Vz being shown in FIGURE 27*b*. Attenuator 228 may be dispensed with if fader amplifier 180 is of a type that may be overdriven without damage or deterioration in performance.

It is evident that variation in bias voltage V*b* will move the control voltage Vz waveform up and down bodily, and this will achieve fading of the insert picture into the background picture (or vice versa) for the following reason. Assume as previously mentioned that a control signal of +.2 volt switches the output of fader amplifier 180 to signal B alone during the duration of such control signal, and a control signal of —.2 volt switches the output to signal A alone during the duration of the —.2 volt control signal (signal A providing the picture subject matter for the main picture display and signal B providing the picture subject matter for the insert). Then adjustment of bias voltage V*b* to move the upper limit of waveform Vz gradually downward will cause the positive extremes of waveform Vz to switch fader amplifier 180 less and less effectively, and output signal S will during these positive extremes contain less and less of signal B and more and more of signal A, until finally, when waveform Vz is moved downwardly enough so that (as shown in FIGURE 27*c*) its upper limit is —.2 volt, output signal S will consist of signal A alone at all times. The picture subject matter of the insert will thus have been faded into the picture subject matter of the main display. The lower limit of waveform Vz will now be —.6 volt instead of —.2 volt; this is more voltage than is needed to switch the content of signal S to signal A during occurrence of these negative extremes, and if fader amplifier 180 employs components to which such overdriving may be harmful, an additional clipping circuit (not shown) may be connected at terminal 200 to limit the voltage extremes of control voltage Vz.

Similarly, adjustment of source 198 to move the lower limit of waveform Vz from —.2 volt gradually to +.2 volt will fade the picture subject matter of the main display into the picture subject matter of the insert.

It will be realized that the particular circuit just described for operating on the signal Z to obtain a pulsed waveform Vz whose upper or lower limits can be shifted up or down, is not special, and different circuits could be devised to fulfill this same purpose.

For example, and as indicated diagrammatically in FIGURE 28, the keyed clamp 210 may be followed by a conventional clipping circuit 238 to remove synchronizing and setup information from the clamped signal Z, and then a series connection of a conventional source of potential 198′ (variable about ground) and a high impedance 240 may be connected at the output of clipping circuit 238 to move the waveform thereof bodily up or down in potential. A suitable attenuator (not shown) may if desired be provided to follow circuit 238 and the series connection of source 198′ and impedance 240.

It is preferred however that a circuit be used in which the signal Z is clipped at both its positive and negative extremes in providing a control voltage Vz (such a circuit being that of FIGURE 26) since this type of circuit largely removes the effects of noise and variations in amplitude which may be present in signal Z.

It may be observed that the circuit of FIGURE 23, in which one fader amplifier is used, together with a variable bias clamp and clip circuit (circuit 196) for its control voltage, will perform some of the functions of two fader amplifiers in series. In other words, it will perform the fading of an insert picture into a background picture or vice versa. Video camera 186 in the FIGURE 23 arrangement may be replaced by a video recorder, or indeed by a pattern generator (such as pattern generator 106). When a pattern generator is used, normally only that part of circuit 196 shown in FIGURE 26 (i.e. circuit 214, the variable bias clipping circuit) need be employed to follow the pattern generator.

A variable bias clipping circuit such as circut 214 may also be usefully employed in circuits of the type shown in FIGURES 12 to 17. An exemplary arrangement is shown in FIGURE 29, which is a modification of FIGURE 13, circuit 214 being inserted between pattern generator 106 and fader amplifier 104'. In this arrangement the picture subject matter of the insert may be faded from the picture subject matter of signal H to signal C (by control of bias voltage V$b$) and at the same time signal C may be faded from signal A to signal B (by control of voltage V$k$). Indeed an insert within an insert may be obtained by appropriate control of voltage V$k$, i.e. the picture of signal C may comprise an insert of the picture of signal A against a display of the picture of signal B, this last mentioned insert being appropriately positioned to be within that portion of the picture of signal C that is displayed as an insert in the display of the picture of signal H. (Camera 186 and circuit 196 may be substituted for pattern generator 106 and circuit 214 respectively in the FIGURE 29 arrangement.)

The FIGURE 23 arrangement may be modified as shown in FIGURE 30, in cases where signal B is of appropriate content, such as white letters displayed against a black background, or a dancer dressed in white silhoutted against a black background. In such cases signal B may be used to insert its own picture into the picture of signal A. As shown in FIGURE 30, signal B is simply sampled and is passed through clamping and clipping circuit 196 to provide a control circuit suitable for switching fader amplifier 180. Again the insert may be faded into the background picture or vice versa by control of bias voltage V$b$ of bias source 198.

FIGURE 31 shows a generalization of the FIGURE 23 circuit. In FIGURE 31 the clamp and clip circuit 196 and the camera 186 have been replaced by a function generator 242 which generates a control voltage for amplifier 180. Function generator 242 can be arranged in known manner to generate a control voltage e.g. of level −.2 volts during the first part of a horizontal scanning line, increasing to 0 volts for a next short interval on the scanning line increasing to +.2 volts for a further interval, then decreasing to 0 volts again for another brief interval on the scanning line, and finally, −.2 volts again for the remainder of the scanning line. The result will be an insert of the subject matter of signal B in a background due to signal A, with the border between the insert and the background being a mix of the two signals. Appropriate control of the voltage produced by function generator 242 will also enable fading of the insert picture into the background picture or vice versa.

We claim.

1. A variable gain circuit comprising
(a) first and second input means for receiving first and second input signals A and B respectively,
(b) adjustable control means having a first control state and a second control state,
(c) said control means including means responsive to a switching signal for switching said control means from said first control state to said second control state for the duration of said switching signal,
(d) amplifier means connected to said signal input means and said control means and responsive to said control means for generating an output signal of the form $pA+qB$ where $p$ and $q$ are coefficients having individual values dependent upon said control means, said amplifier means having a first condition consequent upon assumption of said first control state by said control means in which the sum of said coefficients $p$ and $q$ is variable by adjustment of said control means, and having a second condition consequent upon assumption of said second control state by said control means in which said sum is unity,
(e) and means for coupling said control means to a source of said switching signal, for said switching signal to switch said control means from said first to said second control state for said duration thus to switch the sum of said coefficients $p$ and $q$ to unity for said duration.

2. A variable gain circuit comprising
(a) amplifier means having
(i) first and second signal input means for receiving first and second input signals A and B respectively,
(ii) two control signal input means each for receiving a variable control signal,
(iii) means responsive to said control signals for generating an output signal of the form $pA+qB$ where $p$ and $q$ are coefficients having values dependent upon said control voltages and having their sum equal to unity upon application of a control signal of a selected value at one of said control signal input means,
(b) switching means responsive to a switching signal,
(c) means coupling said switching means at at least one of said control signal input means,
(d) means for coupling said switching means to a source of said switching signal,
(e) said switching means including means for switching, for the duration of said switching signal, the value of a control signal applied to said one control signal input means to said selected value for the sum of said coefficients $p$ and $q$ to become unity for said duration.

3. A variable gain circuit comprising
(a) amplifier means having
(i) first and second signal input means for receiving first and second input signals A and B respectively,
(ii) first and second control signal input means for receiving first and second variable control signals, respectively,
(iii) means responsive to said control signals for generating an output signal of the form $m[(1-k)A+kb]$ where $k$ is a coefficient having a value between zero and unity dependent upon the value of said first control signal applied at said first control signal input means, and $m$ is a coefficient having a value dependent upon said second control signal applied at said second control signal input means and having a value of unity upon application of a selected value of said second signal at said second control signal input means,
(b) switching means responsive to a switching signal,
(c) means coupling said switching means to said second control signal input means,
(d) means for coupling said switching means to a source of said switching signal,
(e) said switching means including means for switching, for the duration of said switching signal, the value of said second control signal applied at said second control signal input means to said selected value for said coefficient $m$ to become equal to unity for said duration.

4. A variable gain circuit comprising (a) amplifier means having
(i) first and second signal input means for receiving first and second input signals A and B respectively,
(ii) first and second control signal input means for receiving first and second variable control signals respectively,
(iii) means responsive to said control signals for generating an output signal of the form $(1-k1)A+k2B$ where $k1$ is a coefficient having a value between zero and unity dependent upon the value of said first control signal applied at said first control signal input means, $k2$ is a coefficient variable between zero and unity dependent upon the value of said second control signal applied at said second control signal input means and $k1$ and $k2$ are equal when said control signals applied at said first and second control signal input means are equal,
(b) switching means responsive to a switching signal,
(c) means coupling said switching means to said first and said second control signal input means,
(d) means for coupling said switching means to a source of switching signal,
(e) said switching means including means for equalizing, for the duration of said switching signal, the values of said first and second control signals applied respectively at said first and second control signal input means, thus to equalize said coefficients $k1$ and $k2$ for said duration.

5. A variable gain circuit comprising
(a) first amplifier means having
(i) first and second signal input means for first and second input signals A and B,
(ii) first control signal input means for a first control signal,
(iii) means responsive to said first control signal and including first and second output means, for generating at said first output means a signal C of the form $(1-k)A+kB$ and at said second output means a signal E of the form $kA+(1-k)B$, where $k$ is a coefficient variable between zero and unity dependent upon the value of said first control signal applied at said first control signal input means,
(b) second amplifier means having input means coupled to said first output means for receiving said signal C, second control signal input means for a second control signal, and third output means for generating at said third output means a signal D of the form $m[(1-k)A+kB]$ where $m$ is a coefficient having a value dependent upon said second control signal applied to said second control signal input means.
(c) switching means responsive to a switching signal,
(d) means for coupling said switching means to a source of said switching signal,
(e) said switching means including means coupled to said second and third output means for delivering an output signal S equal to said signal E for the duration of said switching signal and equal to said signal D in the absence of said switching signal.

6. A variable gain circuit comprising
(a) first fader amplifier means including
(i) first and second video signal input means for first and second video input signals A and B respectively,
(ii) first adjustable control means,
(iii) first output means,
(iv) means coupled to said means (a) (i), (ii) and (iii) for generating at said first output means a video signal of the form $p\text{A}+q\text{B}$ where $p$ and $q$ are coefficients having values dependent upon adjustment of said first control means,
(b) second fader amplifier means including
(i) third and fourth video signal input means for third and fourth video input signals U and V respectively,
(ii) second adjustable control means,
(iii) second output means,
(iv) means coupled to said means (b) (i), (ii) and (iii) for generating at said second output means a video output signal S of the form $p'\text{U}+q'\text{V}$ where $p'$ and $q'$ are coefficients having values dependent upon adjustment of said second control means,
(c) and means coupling said first output means to said third video signal input means.

7. A variable gain circuit comprising
(a) first fader amplifier means including
(i) first and second video signal input means for video input signals A and B respectively,
(ii) first control signal input means for a first variable control signal,
(iii) first output means,
(iv) means coupled to said first and second signal input means, to said control signal input means, and to said first output means, for generating at said first output means a video signal C of the form $(1-k)A+kB$ where $k$ is a coefficient variable between zero and unity dependent upon said first control signal and having a value of zero consequent upon a first value of said first control signal applied at said first control signal input means and having a value of unity consequent upon a second value of said first control signal applied at said first control signal input means,
(b) and second fader amplifier means including
(i) third video signal input means coupled to said first output means for said signal C, and fourth video signal input means for a video signal E,
(ii) second control signal input means for a second variable control signal,
(iii) second output means,
(iv) means coupled to said third and fourth signal input means, to said second control signal input means and to said second output means for generating at said second output means a video output signal S of the form $(1-n)C+nE$ where $n$ is a coefficient variable between zero and unity dependent upon said second control signal and having a value of zero consequent upon a first value of said second control signal applied at said second control signal input means and having a value of unity consequent upon a second value of said second control signal applied at said second control signal input means.

8. A variable gain circuit comprising
(a) fader amplifier means including
(i) first and second video signal input means for video input signals A and B respectively,
(ii) adjustable control means,
(iii) first output means,
(iv) means coupled to said first and second signal input means, to said control means, and to said first output means, for generating at said first output means a video signal of the form $pA+qB$ where $p$ and $q$ are coefficients having values dependent upon adjustment of said control means,
(b) fader amplifier switching means including
(i) third and fourth video signal input means for third and fourth video input signals respectively,
(ii) switching signal input means for a switching signal having first and second values,
(iii) second output means,
(iv) means coupled to said third and fourth signal input means, to said switching signal input means, and to said second output means for delivering to said second output means said third input signal when said switching signal has said first value and said fourth input signal when said switching signal has said second value, (c) and means coupling said first output means to said third signal input means.

9. A variable gain circuit comprising (a) first fader amplifier means comprising (i) first video signal input means for a video signal A, (ii) first control signal input means for a first variable control signal, (iii) first and second output means, (iv) and means coupled to each of said means (a) (i), (ii) and (iii) for generating at said first output means a video signal of the form $(1-kl)A$ and at said second output means a video signal of the form $k1A$, where $k1$ is a coefficient having values between zero and unity dependent upon said first control signal, (b) second fader amplifier means comprising (i) second video signal input means for a video input signal B, (ii) second control signal input means for a second variable control signal, (iii) third and fourth output means, (iv) and means coupled to each of said means (b) (i), (ii) and (iii) for generating at said third output means a video signal of the form $(1-k2)B$ and at said fourth output means a video signal of the form $k2B$, where $k2$ is a coefficient having values between zero and unity dependent upon said second control signal, (c) means coupling together said first and fourth output means for the signals thereat to add as a video signal X of the form $(1-k1)A+k2B$, (d) means coupling together said second and third output means for the signals thereat to add as a video signal Y of the form $k1A+(1-k2)B$, (e) and third fader amplifier means comprising (i) third video signal input means coupled to said means (c) for receiving said signal X, (ii) fourth video signal input means coupled to said means (d) for receiving said signal Y, (iii) third control signal input means for a third variable control signal, (iv) fifth output means, (v) means coupled to said means (e) (i), (ii), (iii) and (iv) for generating at said fifth output means a video output signal S of the form $(1-n)X+nY$ where $n$ is a coefficient variable between 0 and 1 dependent upon said third control signal and having values of 0 and 1 respectively when said third control signal has first and second values respectively.

10. A variable gain circuit according to claim 9 including (f) means for generating a switching signal having first and second switching values equal to said first and second values respectively of said third control signal, (g) and means coupling said means (f) to said third control signal input means.

11. A variable gain circuit comprising (a) first fader amplifier means comprising (i) first video signal input means for video input signal A, (ii) first control signal input means for a first variable control signal, (iii) first and second output means, (iv) and means coupled to each of said means (a) (i), (ii) and (iii) for generating at said first output means a video signal of the form $(1-k1)A$ and at said second output means a video signal of the form $k1A$, where $k1$ is a coefficient having values between zero and unity dependent upon said first control signal, (b) second fader amplifier means comprising (i) second video signal input means for a video input signal B, (ii) second control signal input means for a second variable control signal, (iii) third and fourth output means, (iv) and means coupled to each of said means (b) (i), (ii), and (iii) for generating at said third output means a video signal of the form $(1-k2)B$ and at said fourth output means a video signal of the form $k2B$, where $k2$ is a coefficient having values between zero and unity dependent upon said second control signal and having a value equal to the value of said coefficient $k1$ when said first and second control signals are equal, (c) means coupling together said first and fourth output means for the signals thereat to add as a video signal X of the form $(1-k1)A+k2B$, (d) means coupling together said second and third output means for the signals thereat to add as a video signal Y of the form $k1A+(1-k2)B$, (e) third fader amplifier means comprising (i) third video signal input means coupled to said means (c) for receiving said signal X, (ii) fourth video signal input means coupled to said means (d) for receiving said signal Y, (iii) third control signal input means for a third variable control signal, (iv) fifth output means, (v) means coupled to said means (e) (i), (ii), (iii) and (iv) for generating at said fifth output means a video output signal S of the form $(1-n)X+nY$ where $n$ is a coefficient variable between 0 and 1 dependent upon said third control signal and having values of 0 and 1 respectively when said third control signal has first and second values respectively.

(f) means for generating a switching signal having first and second switching values equal to said first and second values respectively of said third control signal, (g) means coupling said means (f) to said third control signal input means, (h) switching means responsive to a blanking signal, (i) means coupling said switching means to said first and second control signal input means, (j) means for coupling said switching means to a source of blanking signal, (k) said switching means including means for equalizing, for the duration of said blanking signal, the values of said first and second control signals applied respectively at said first and second control signal input means, thus to equalize said coefficients $k1$ and $k2$ for said duration.

12. A variable gain circuit including (a) fader amplifier switching means comprising (i) first signal input means for an input signal A, (ii) second signal input means for an input signal B, (iii) first and second output means, (iv) switching signal input means for a switching signal V$n$ having first and second values, (v) and means coupled to said means (a)(i), (ii), (iii) and (iv) for delivering to said first output means a signal X1 of the form $$(1-n)A+nB$$

and to said second output means a signal Y1 of the form $nA+(1-n)B$, where $n$ is a coefficent variable between 0 and 1 dependent upon said signal V$n$ and having values of 0 to 1 respectively when said signal $Vn$ has said first and second values respectively, (b) second fader amplifier means comprising (i) third signal input means coupled to said first output means for receiving said signal X1, (ii) first control signal input means for a first variable control signal, (iii) third output means, (iv) means coupled to said means (b)(i), (ii) and (iii) for generating at said third output means a third output signal of the form $$(1-k1)X1$$

where $k1$ is a coeffecent variable between zero and one dependent upon said first control signal, (c) third fader amplifier means comprising (i) fourth signal input means coupled to said second output means for receiving said signal Y1, (ii) second control signal input means for a second variable control signal, (iii) fourth output means, (iv) means coupled to said means (c)(i), (ii), and (iii) for generating at said fourth output means a fourth output signal of the form $k2Y1$, where $k2$ is a coefficient variable between zero and one dependent upon said second variable control signal, (d) and means for coupling together said third and fourth output means.

13. A variable gain circuit comprising (a) a first fader amplifier including (i) first and second pairs of like polarity transistors, (ii) first and second current generator means each for generating a current responsive to an input signal applied thereto, (iii) means connecting the emitters of said first pair of transistors together and to said first current generator means, (iv) means connecting the emitters of said second pair of transistors together and to said second current generator means, (v) and means for applying a first control signal to the base of one transistor of said first pair and to the base of one transistor of said second pair, (b) a second fader amplifier including (i) third and fourth pairs of like polarity transistors, (ii) means connecting together the emitters of said third pair of transistors, (iii) means connecting together the emitters of said fourth pair of transistors, (iv) and means for applying a second control signal to the base of one transistor of said third pair and to the base of one transistor of said fourth pair, (c) means coupling the emitters of said fourth pair of transistors to the collector of said one transistor of said first pair and to the collector of the other transistor of said second pair, (d) means coupling the emitters of said third pair of transistors to the collector of said other transistor of said first pair and to the collector of said one transistor of said second pair, (e) and output means connected to the collector of said one transistor of one of said third and fourth pairs and to the collector of the other transistor of the other of said third and fourth pairs.

14. A variable gain circuit comprising (a) a first fader amplifier including (i) first and second pairs of like polarity transistors, (ii) first and second current generator means each for generating a current responsive to an input signal applied thereto, (iii) means connecting the emitters of said first pair of transistors together and to said first current generator means, (iv) means connecting the emitters of said second pair of transistors together and to said second current generator means, (v) and means for applying a first control signal to the base of one transistor of said first pair and to the base of one transistor of said second pair, (b) a second fader amplifier including (i) third and fourth pairs of like polarity transistors, (ii) means connecting together the emitters of said third pair of transistors, (iii) means connecting together the emitters of said fourth pair of transistors, (iv) and means for applying a second control signal to the base of one transistor of said third pair and to the base of one transistor of said fourth pair, (c) means connecting the emitters of said fourth pair of transistors directly to the collector of said one transistor of said first pair and to the collector of the other transistor of said second pair, (d) and output means connected to the collector of said one transistor of one of said third and fourth pairs and to the collector of the other transistor of the other of said third and fourth pairs.

15. A variable gain circuit comprising (a) first fader amplifier including (i) first and second pairs of like polarity transistors, (ii) first current generator means having first signal input means for generating a current responsive to a video input signal A applied to said first signal input means, said first current generator means also producing a direct current component, (iii) means connecting the emitters of said first pair of transistors together and to said first current generator means, (iv) means for generating a current equal to said direct current component, (v) means connecting the emitters of said second pair of transistors together and to said means (a) (iv), (vi) and means for applying a first control signal $Vk1$ to the base of one transistor of said first pair and to the base of one transistor of said second pair, (b) a second fader amplifier including (i) third and fourth pairs of transistors of the same polarity as those of said first and second pairs, (ii) second current generator means having second signal input means for generating a current responsive to a video input signal B applied to said second signal input means, said second current generator means also producing a second direct current component, (iii) means connecting the emitters of said third pair of transistors together and to said second current generator means, (iv) means for generating a current equal to said second direct current component, (v) means connecting the emitters of said fourth pair of transistors together and to said means (b) (iv), (vi) and means for applying a second control signal $Vk2$ to the base of one transistor of said third pair and to the base of one transistor of said fourth pair, (c) a third fader amplifier including
(i) fifth and sixth pairs of transistors of opposite polarity to those of said first to fourth pairs,
(ii) means connecting together the emitters of said fifth pair of transistors,
(iii) means connecting together the emitters of said sixth pair of transistors,
(iv) and means for applying a third control signal V*n* to the base of one transistor of said fifth pair and to the base of one transistor of said sixth pair,
(d) first and second constant current generating means,
(e) means coupling the emitters of said fifth pair to the collectors of said one transistor of said first and third pairs, to the collectors of said other transistors of said second and fourth pairs, and to said first constant current generating means,
(f) means coupling the emitters of said sixth pair to the collectors of said other transistor of said first and third pairs, to the collectors of said one transistor of said second and fourth pairs, and to said second constant current generating means,
(g) and output means connected to the collector of said one transistor of one of said fifth and sixth pairs and to the collector of the other transistor of the other of said fifth and sixth pairs.

16. A circuit according to claim 15 including
(h) switching means responsive to a switching signal,
(i) means coupling said switchiing means to said means (a) (vi) and to said means (b) (vi),
(j) means for coupling said switching means to a source of switching signal,
(k) said switching means including means for equalizing, for the duration of said switching signal, the values of said first and second control signals V*k*1 and V*k*2.

17. A circuit according to claim 15 including
(h) a first selector switch having a first terminal for an input signal H, and having second and third terminals,
(i) a second selector switch having fourth and fifth terminals connected in series in said means (e) with said fifth terminal connected to the emitters of said fifth pair of transistors, said second selector switch also having a sixth terminal connected to said third terminal,
(j) means connecting said second terminal to said first signal input means,
(k) said first selector switch including means for connecting either of said first and second terminals to said third terminal, and said second selector switch including means for connecting either of said fourth and sixth terminals to said fifth terminal.

18. A variable gain circuit according to claim 17 wherein
(l) said first constant current generating means includes a thirteenth transistor of the same polarity as those of said fifth and sixth pairs, the collector of said thirteenth transistor being connected to said means (e),
(m) said second constant current generating means includes a fourteenth transistor of the same polarity as said thirteenth transistor, the collector of said fourteenth transistor being connected to said means (f),
said variable gain circuit further including
(n) switching means responsive to a switching signal,
(o) means coupling said switching means to said means (a) (vi) and to said means (b) (vi),
(p) means for coupling said switcihng means to a source of switching signal,
(q) said switching means including means for equalizing, for the duration of said switching signal, the values of said first and second control signals V*k*1 and V*k*2.

19. A variable gain circuit for inserting one television picture within a selected outline in a display of another television picture, said circuit comprising:
(a) a fader amplifier of the type including
(i) first input means for a first video signal A for one of said pictures and second input means for a second video signal B for the other of said pictures,
(ii) control signal input means,
(iii) output means,
(iv) means coupled to said first and second input means, to said control signal input means, and to said output means, for delivering to said output means an output signal containing proportions of said signals A and B as determined by a control signal applied to said control signal input means, said output signal comprising said signal A alone under one value of said control signal and comprising said signal B alone under another value of said control signal,
(b) means for producing a video signal Z generated by video scanning means scanning a scene containing an object of said selected outline strongly contrasted against a background,
(c) means for operating on said signal Z to produce a control signal Vz having one of said values when said signal Z represents said background and the other of said values when said signal Z represents said object,
(d) means for synchronizing said signals A, B and Z,
(e) and means for applying said control signal Vz to said control signal input means.

20. A variable gain circuit comprising
(a) fader amplifier means including
(i) first and second video signal input means for video input signals A and B respectively,
(ii) adjustable control means,
(iii) first output means,
(iv) means coupled to said first and second signal input means, to said control means, and to said first output means, for generating at said first output means a video signal of the form $pA+qB$ where $p$ and $q$ are coefficients having values dependent upon adjustments of said control means,
(b) fader amplifier switching means including
(i) third and fourth video signal input means for third and fourth video input signals respectively,
(ii) switching signal input means for a switching signal having first and second values,
(iii) second output means,
(iv) means coupled to said means (b) (i), (ii) and (iii) for delivering to said second output means a video output signal containing proportions of said third and fourth input signals as determined by said switching signal, said output signal comprising said third input signal when said switching signal has said first value and said fourth input signal when said switching signal has said second value,
(c) means coupling said first output means to said third signal input means,
(d) means, including video scanning means for scanning a scene containing an object of said selected outline strongly contrasted against a background, for generating a pulsed video signal Z having first and second voltage extremes dependent upon whether said background or said object is being scanned,
(e) means operating on said signal Z for producing a switching signal Vz and including (i) means for establishing one of said extremes at said first value, including means for varying said one extreme from said first value to said second value, and (ii) means for establishing the other of said extremes at said second value, including means for varying said other extreme from said second value to said first value, (f) means for synchronizing said signals A, B, and Z, (g) and means for applying said switching signal Vz to said means (b) (ii).

References Cited

UNITED STATES PATENTS 3,272,919 9/1966 Thompson ---------- 178—7.1

ROBERT L. GRIFFIN, Primary Examiner

ROBERT L. RICHARDSON, Assistant Examiner

U.S. Cl. X.R.

178—6; 330—29